United States Patent
More et al.

(10) Patent No.: US 11,942,552 B2
(45) Date of Patent: Mar. 26, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Shahaji B. More, Hsinchu (TW); Chun Hsiung Tsai, Xinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/740,097

(22) Filed: May 9, 2022

(65) Prior Publication Data

US 2022/0262955 A1    Aug. 18, 2022

Related U.S. Application Data

(63) Continuation of application No. 16/940,312, filed on Jul. 27, 2020, now Pat. No. 11,329,163.

(51) Int. Cl.
*H01L 29/786* (2006.01)
*H01L 21/02* (2006.01)
(Continued)

(52) U.S. Cl.
CPC .. *H01L 29/78618* (2013.01); *H01L 21/02532* (2013.01); *H01L 21/02603* (2013.01);
(Continued)

(58) Field of Classification Search
CPC ......... H01L 29/78618; H01L 21/02532; H01L 21/02603; H01L 21/823807;
(Continued)

(56) References Cited

U.S. PATENT DOCUMENTS 9,209,247 B2    12/2015    Colinge et al.
9,236,267 B2    1/2016    De et al.
(Continued)

OTHER PUBLICATIONS

Non-Final Office Action issued in U.S. Appl. No. 16/940,312 dated Jun. 23, 2021.
(Continued)

*Primary Examiner* — Tong-Ho Kim
(74) *Attorney, Agent, or Firm* — STUDEBAKER & BRACKETT PC

(57) ABSTRACT

In a method of manufacturing a semiconductor device, a fin structure is formed. The fin structure includes a stacked layer of first semiconductor layers and second semiconductor layers disposed over a bottom fin structure, and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. A first dielectric layer is formed, and a second dielectric layer made of a different material than the first dielectric layer is formed over the first dielectric layer. The second dielectric layer is recessed, and a third dielectric layer made of a different material than the second dielectric layer is formed on the recessed second dielectric layer, thereby forming a wall fin structure.

20 Claims, 33 Drawing Sheets

(51) Int. Cl.
*H01L 21/8238* (2006.01)
*H01L 27/092* (2006.01)
*H01L 29/06* (2006.01)
*H01L 29/423* (2006.01)
*H01L 29/66* (2006.01)

(52) U.S. Cl.
CPC ......... *H01L 21/823807* (2013.01); *H01L 21/823814* (2013.01); *H01L 21/823828* (2013.01); *H01L 21/823864* (2013.01); *H01L 21/823878* (2013.01); *H01L 27/092* (2013.01); *H01L 29/0653* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
CPC ..... H01L 21/823814; H01L 21/823828; H01L 21/823864; H01L 21/823878; H01L 27/092; H01L 29/0653; H01L 29/0673; H01L 29/42392; H01L 29/66545; H01L 29/66553; H01L 29/66742; H01L 29/78696; H01L 21/823481; H01L 27/088; H01L 21/823418; H01L 29/66439; H01L 29/775; H01L 27/0886; H01L 27/0924; B82Y 10/00

USPC ........................................................ 257/351
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,329,163 | B2 * | 5/2022 | More .............. H01L 21/823481 |
| 2016/0005831 | A1 | 1/2016 | Ando et al. |
| 2021/0020524 | A1 * | 1/2021 | Wang .............. H01L 21/823821 |
| 2021/0057525 | A1 | 2/2021 | Chiang et al. |
| 2021/0272856 | A1 * | 9/2021 | Pan .................. H01L 21/02603 |

OTHER PUBLICATIONS

Notice of Allowance issued in U.S. Appl. No. 16/940,312 dated Jan. 10, 2022.

* cited by examiner

METHOD OF MANUFACTURING A SEMICONDUCTOR DEVICE AND A SEMICONDUCTOR DEVICE

RELATED APPLICATIONS

This application is a continuation of U.S. patent application Ser. No. 16/940,312 filed Jul. 27, 2020, now U.S. Pat. No. 11,329,163, the entire content of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 2:
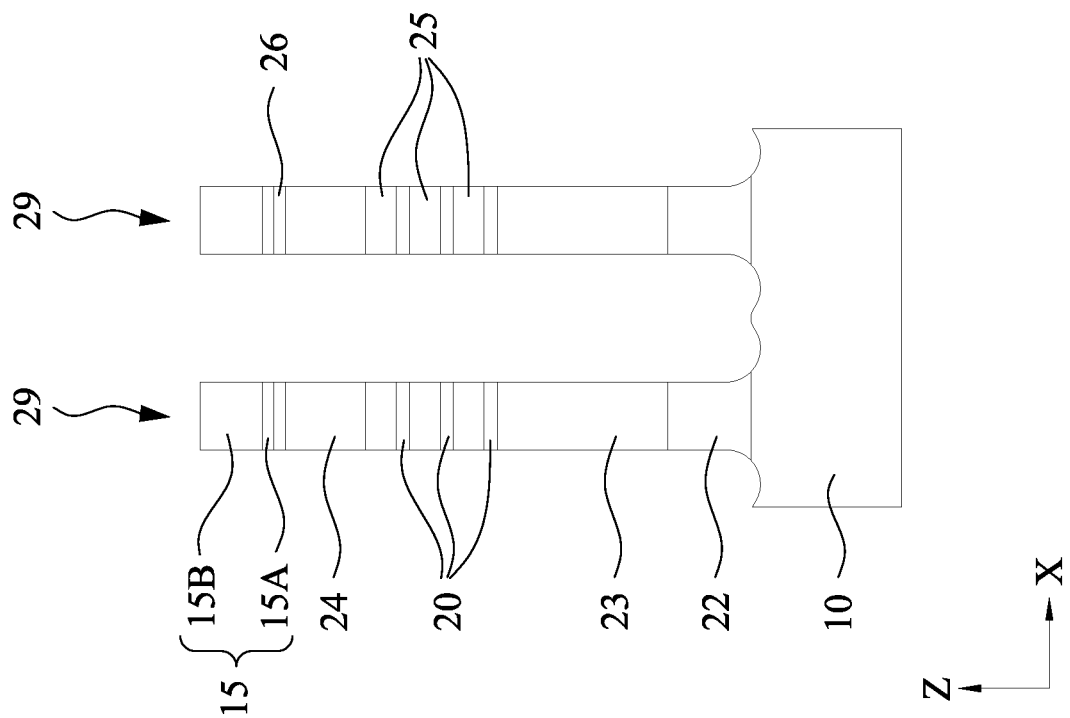
FIGS. 1, 2, 3, 4, 5, 6, 7 and 8 shows cross sectional views of various stages of manufacturing a semiconductor GAA FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

One of the factors to determine device performance of a field effect transistor (FET), such as a fin FET (FinFET) and a gate-all-around (GAA) FET, is a shape of an epitaxial source/drain structure. In particular, when a source/drain region of a FinFET or a GAA FET is recessed and then an epitaxial source/drain layer is formed therein, the etching substantially defines the shape of the epitaxial source/drain structure. Further, when two adjacent fin structures are closer to each other, the epitaxial layers undesirably merge with each other. In the present disclosure, a wall fin structure (a dielectric dummy fin structure) is employed to physically and electrically separate adjacent source/drain epitaxial layers and to define the shape of the source/drain epitaxial layer. An optimal source/drain shape can improve a FinFET's and GAA FET's Ion/Ioff current ratio, and can improve device performance.

In this disclosure, a source/drain refers to a source and/or a drain. It is noted that in the present disclosure, a source and a drain are interchangeably used and the structures thereof are substantially the same.

FIG. 1-21C show various stages of manufacturing a semiconductor GAA FET device according to an embodiment of the present disclosure. It is understood that additional operations can be provided before, during, and after processes shown by FIGS. 1-21C, and some of the operations described below can be replaced or eliminated, for additional embodiments of the method. The order of the operations/processes may be interchangeable.

Figure 1:
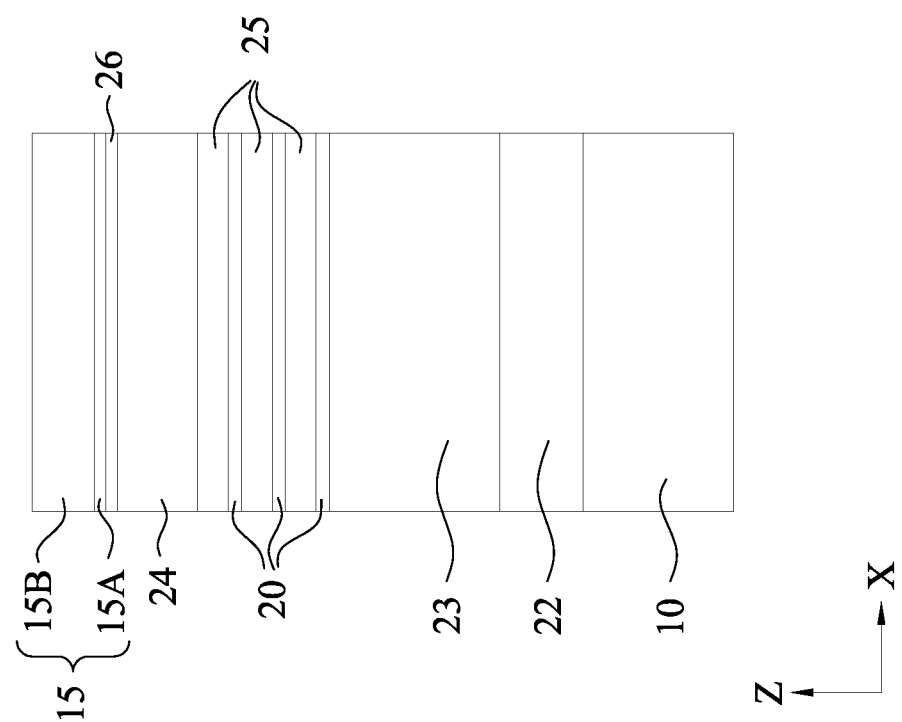

As shown in FIG. 1, a first bottom semiconductor layer 22 is epitaxially formed on a semiconductor substrate 10. In some embodiments, the semiconductor substrate 10 is a crystalline Si substrate. In other embodiments, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate.

The first bottom semiconductor layer 22 is made of different material than the substrate 10. When the substrate 10 is a Si substrate, the first bottom semiconductor layer 22 includes SiGe, where a Ge content is about 10 atomic % to about 60 atomic % ($S_{0.9}Ge_{0.1}$—$S_{0.4}Ge_{0.6}$) in some embodiments. The thickness of the first bottom semiconductor layer 22 is in a range from about 4 nm to about 30 nm in some embodiments, and is in a range from about 5 nm to about 25 nm in other embodiments.

Further, a second bottom semiconductor layer 23 is epitaxially formed over the first bottom semiconductor layer 22. The second bottom semiconductor layer 23 is made of different material than the first bottom semiconductor layer 22. When the first bottom semiconductor layer 22 is made of SiGe, the second bottom semiconductor layer 23 includes Si or SiGe, where a Ge content is smaller than the first bottom semiconductor layer 22 and is more than 0 atomic % to about 10 atomic % in some embodiments. The thickness of the second bottom semiconductor layer 23 is in a range from about 40 nm to about 200 nm in some embodiments, and is in a range from about 50 nm to about 150 nm in other embodiments.

Then, first semiconductor layers 20 and second semiconductor layers 25 are alternately formed over the second bottom semiconductor layer 23. In some embodiments, the first and second bottom semiconductor layers are not formed, and the first semiconductor layers 20 and second semiconductor layers 25 are formed directly on the substrate 10.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.2 and equal to or less than about 0.6, and the second semiconductor layers 25 are Si or $Si_{1-y}Ge_y$, where y is smaller than x and equal to or less than about 0.1. In this disclosure, an "M" compound" or an "M based compound" means the majority of the compound is M.

The thickness of the first semiconductor layers 20 may be equal to or smaller than that of the second semiconductor layers 25, and is in a range from about 4 nm to about 30 nm in some embodiments, and is in a range from about 5 nm to about 20 nm in other embodiments. The thickness of the second semiconductor layers 25 is in a range from about 4 nm to about 30 nm in some embodiments, and is in a range from about 5 nm to about 20 nm in other embodiments. The thicknesses of the first semiconductor layers 20 may be the same as, or different from each other and the thicknesses of the second semiconductor layers 25 may be the same as, or different from each other. Although three first semiconductor layers 20 and three second semiconductor layers 25 are shown in FIG. 1, the numbers are not limited to three, and can be 1, 2 or more than 3, and less than 10.

Moreover, in some embodiments, a top semiconductor layer 24 is epitaxially formed over the stacked structure of the first semiconductor layers 20 and the second semiconductor layers 25. In some embodiments, the top semiconductor layers 24 are $Si_{1-z}Ge_z$, where z is equal to or more than about 0.2 and equal to or less than about 0.7. In some embodiments, z=x. The thickness of the top semiconductor layer 24 is greater than that of each of the first semiconductor layers 20 and the second semiconductor layers 25. In some embodiments, the thickness of the top semiconductor layer 24 is in a range from about 10 nm to about 100 nm, and is in a range from about 20 nm to about 50 nm in other embodiments. Further, in some embodiments, a cap semiconductor layer 26 made of a different material than the top semiconductor layer 24 is epitaxially formed on the top semiconductor layer 24. In some embodiments, the cap semiconductor layer is made of Si and has a thickness in a range from about 0.5 nm to about 10 nm. The cap semiconductor layer 26 is used to control Ge out-diffusion from the top semiconductor layer 24, and to maintain the quality of the surface of the top semiconductor layer 24 during a chemical mechanical polishing (CMP) process subsequently performed.

Further, a hard mask layer 15 including one or more layers of an insulating material or an amorphous semiconductor material (e.g., a-Si) is formed over the cap semiconductor layer 26. In some embodiments, the hard mask layer 15 includes a first hard mask layer 15A and a second hard mask layer 15B. In some embodiments, the first hard mask layer 15A is silicon oxide having a thickness in a range from 1 nm to about 20 nm and the second hard mask layer 15B is silicon nitride having a thickness in a range from about 10 nm to about 100 nm.

After the stacked layers as shown in FIG. 1 are formed, fin structures are formed by using one or more lithography and etching operations, as shown in FIG. 2. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the hard mask layer 15. By using the patterned hard mask layer as an etching mask, the stacked semiconductor layers are patterned into fin structures 29 as shown in FIG. 2. In some embodiments, the top semiconductor layer 24 and the cap semiconductor layer 26 are part of the hard mask layer and an etch stop layer for a CMP process subsequently performed.

In FIG. 2, the fin structures 29 extend in the Y direction and are arranged in the X direction. The number of the fin structures is not limited to two as shown in FIG. 2, and may be as small as one and three or more. In some embodiments, one or more dummy fin structures are formed on both sides of the fin structures 29 to improve pattern fidelity in the patterning operations.

The width of the upper portion of the fin structure 29 along the Y direction is in a range from about 5 nm to about 40 nm in some embodiments, and is in a range from about 10 nm to about 30 nm in other embodiments.

After the fin structures 29 are formed, one or more liner insulating layers 18 are formed over the fin structures 29, and an insulating material layer 30 including one or more layers of insulating material is formed over the substrate so that the fin structures 29 with the liner layer 18 are fully embedded in the insulating layer 30.

Figure 3:
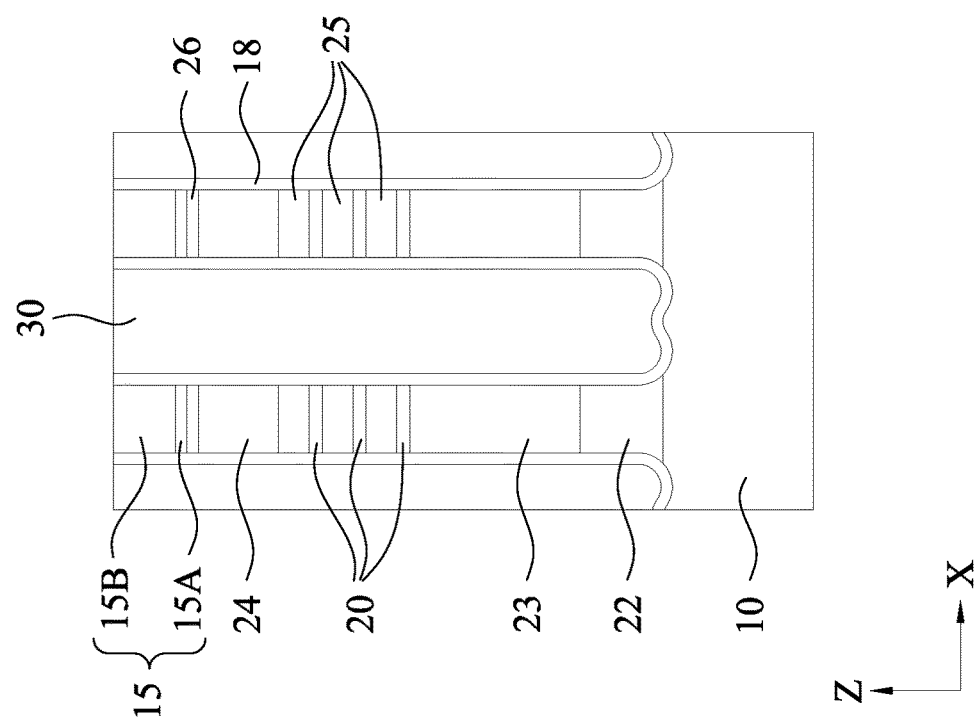

The insulating material for the liner layer 18 and the insulating layer 30 are the same or different from each other, and include one or more of silicon oxide, silicon nitride, silicon oxynitride (SiON), SiOCN, SiOC, SiCN, fluorine-doped silicate glass (FSG), or a low-k dielectric material. In some embodiments, the liner layer 18 is made of silicon oxide or silicon nitride, and the insulating layer 30 is made of silicon oxide. The insulating material is formed by LPCVD (low pressure chemical vapor deposition), plasma-enhanced CVD (PECVD), flowable CVD and/or atomic layer deposition (ALD). An anneal operation may be performed after the formation of the insulating layer 30. Then, a planarization operation, such as a chemical mechanical polishing (CMP) method and/or an etch-back method, is performed such that the upper surface of the hard mask layer 15 (the second hard mask layer 15B) is exposed from the insulating material layer 30, as shown in FIG. 3.

Figure 4:
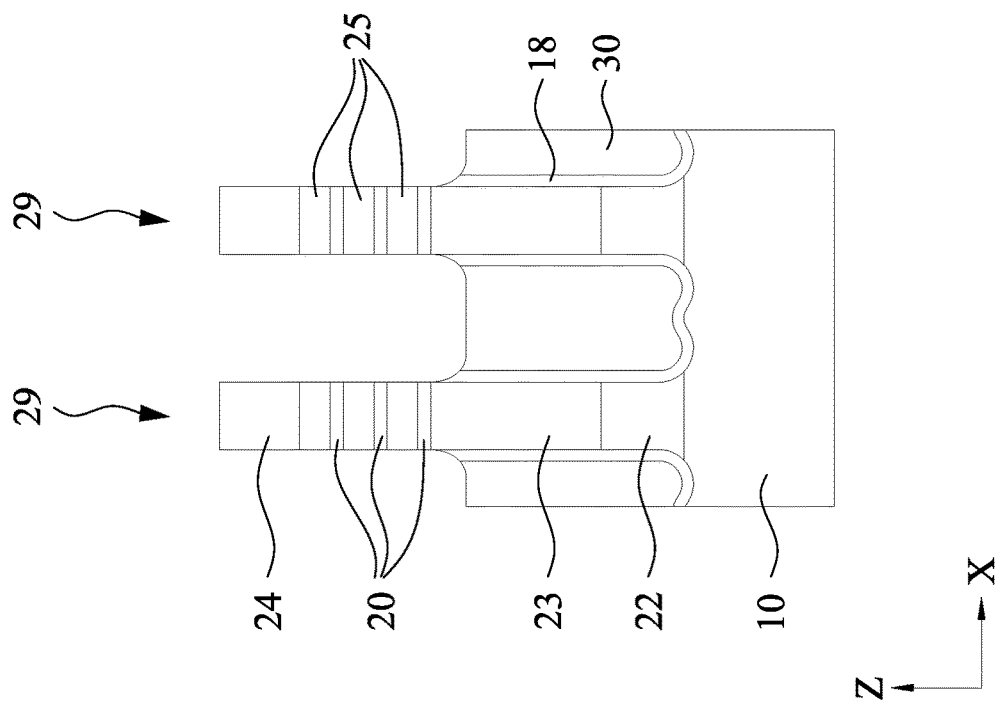

Then, as shown in FIG. 4, the insulating material layer is recessed to form an isolation insulating layer 30 so that the upper portions of the fin structures 29 are exposed. With this operation, the fin structures 29 are separated from each other by the isolation insulating layer 30, which is also called a shallow trench isolation (STI).

In some embodiments, the insulating material layer 30 is recessed until the upper portion of the second bottom semiconductor layer 23 is exposed. The first semiconductor layers 20 are sacrificial layers which are subsequently removed, and the second semiconductor layers 25 are subsequently formed into semiconductor wires or sheets as channel layers of a GAA FET. In some embodiments, during or after the recess etching of the insulating layer 30, the liner layer 18, the hard mask layer 15 and the cap semiconductor layer 26 are removed, thereby exposing the top semiconductor layer 24, as shown in FIG. 4.

Figure 5:
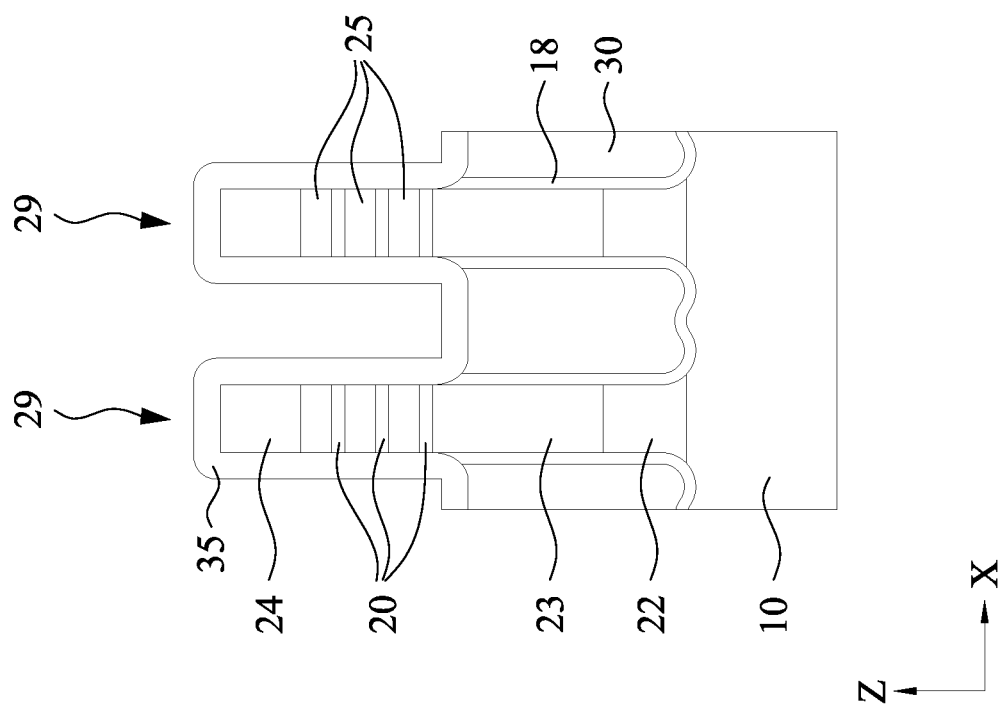

After the isolation insulating layer 30 is formed, a sacrificial cladding layer 35 is formed over the exposed portion of the fin structures 29, as shown in FIG. 5. The sacrificial cladding layer 35 includes one or more insulating materials or semiconductor materials. In some embodiments, the sacrificial cladding layer 35 includes amorphous or poly crystalline semiconductor material (e.g., Si, SiC, SiGe or Ge). In certain embodiments, the sacrificial cladding layer 35 is amorphous SiGe, having a Ge concentration in a range from about 20 atomic % to about 40 atomic %. In some embodiments, the Ge concentration of the sacrificial cladding layer 35 is the same as or similar to (difference within ±5%) the Ge concentration of the first semiconductor layer 20. In some embodiments, the thickness of the sacrificial cladding layer 35 is in a range from about 5 nm to about 50 nm. If the thickness of the sacrificial cladding layer 25 is smaller than this range, a space for a metal gate formation is too small and some of the layers of the metal gate structure would not be properly formed. If the thickness of the sacrificial cladding layer 25 is larger than this range, electrical separation between adjacent fin structures would be insufficient. In some embodiments, before forming the sacrificial cladding layer 35, a thin semiconductor layer is formed over the exposed portion of the fin structures 29. In some embodiments, the thin semiconductor layer is non-doped Si. In some embodiments, the non-doped Si is crystalline Si. In some embodiments, the thickness of the thin semiconductor layer is in a range from about 2 nm to about 3 nm. The sacrificial cladding layer 35 is conformally formed by CVD or ALD in some embodiments. The deposition temperature of the sacrificial cladding layer 35 is less than or similar to the deposition temperature of the first semiconductor layers 20, in some embodiments. In some embodiments, the deposition temperature of the sacrificial cladding layer 35 is in a range from about 500° C. to 650° C. The source gas includes a mixture of $SiH_4$, $GeH_4$, and HCl with $H_2$ or $N_2$ as a carrier gas. The sacrificial cladding layer 35 controls stress in the isolation area.

Figure 6:
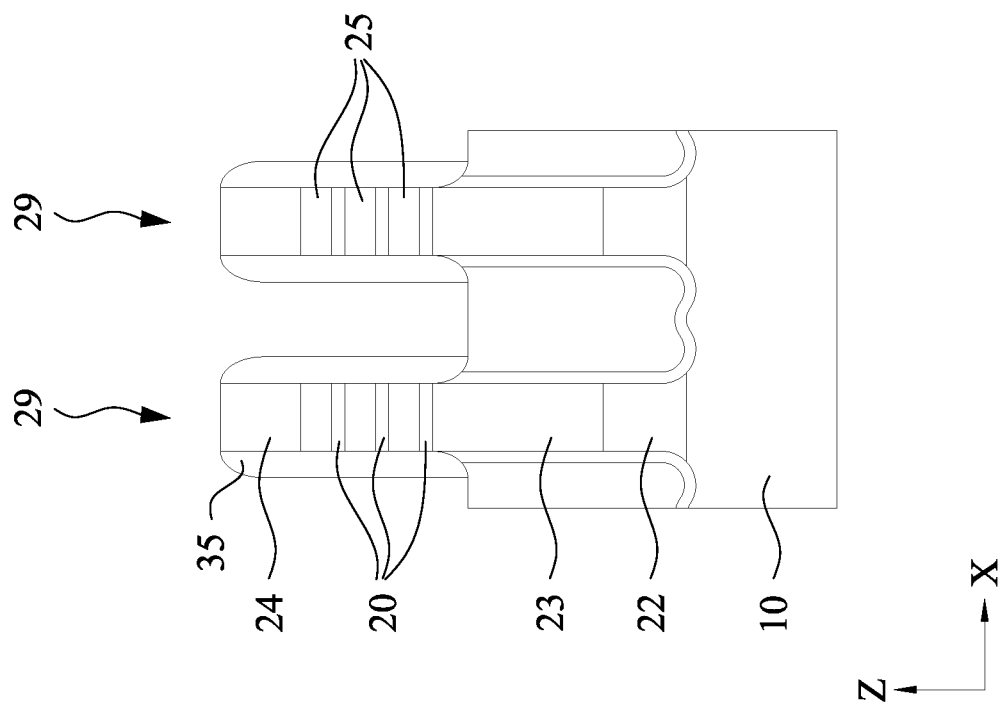

Then, as shown in FIG. 6, one or more etch-back operations are performed to remove horizontal portions of the sacrificial cladding layer 35 so as to expose the upper surface of the top semiconductor layer 24 and the upper surface of the isolation insulating layer 30. In some embodiments, the etch-back operation includes a deposition-etching process. In some embodiments, the plasma generated from CH$_4$ is used for the deposition phase, and the plasma generated from HBr and He is used for the etching phase, which are repeated. In some embodiments, after the deposition-etching operation, a wet cleaning process to remove residuals is performed.

Figure 7:
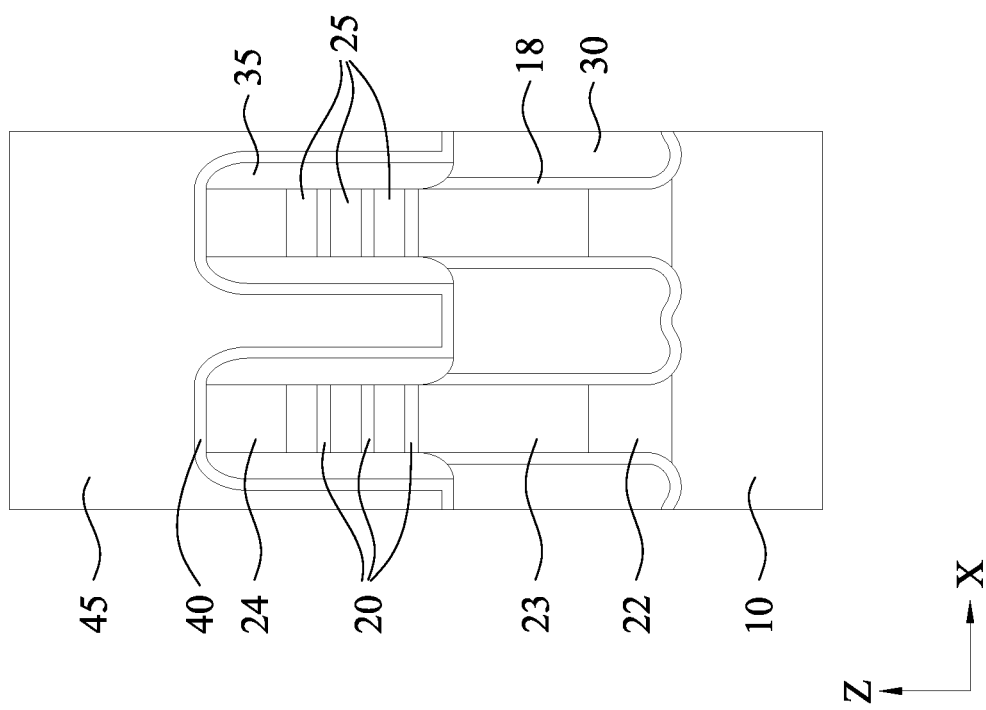

Subsequently, a first dielectric layer 40 is formed over the fin structures, and a second dielectric layer 45 is formed over the first dielectric layer 40 such that the fin structures are fully embedded in the second dielectric layer 45, as shown in FIG. 7. The first dielectric layer 40 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, SiCN or SiOCN is used as the first dielectric layer 40. In some embodiments, as shown in FIG. 7, the first dielectric layer 40 is conformally formed over the fin structures such that a space is formed between adjacent fin structures. The thickness of the first dielectric layer 40 is in a range of about 2.5 nm to about 20 nm in some embodiments, and is in a range from about 5 nm to about 10 nm in other embodiments.

The material of the second dielectric layer 45 is different from the material of the first dielectric layer 40. In some embodiments, the second dielectric layer 45 includes one or more layers of insulating materials such as silicon oxide, silicon oxynitride, silicon nitride, SiOC, SiCN or SiOCN formed by LPCVD, plasma-CVD or ALD, or any other suitable film formation method. In some embodiments, the second dielectric layer 45 is made of silicon nitride or silicon oxide. In some embodiments, the second dielectric layer 45 includes a first layer and a second layer. The first layer is silicon oxide formed by, for example, a flowable CVD process followed by a thermal annealing process at 400° C. to 800° C. in an inert gas ambient. The second layer is also silicon oxide formed by a plasma CVD process. The thickness of the second dielectric layer 45 is in a range of about 60 nm to about 500 nm in some embodiments. As shown in FIG. 7, the second dielectric layer 45 fully fills the space between adjacent fin structures, in some embodiments. In other embodiments, a void is formed in the bottom part of the space. In some embodiments, one or more additional dielectric layers are formed between the first dielectric layer 40 and the second dielectric layer 45.

Figure 8:
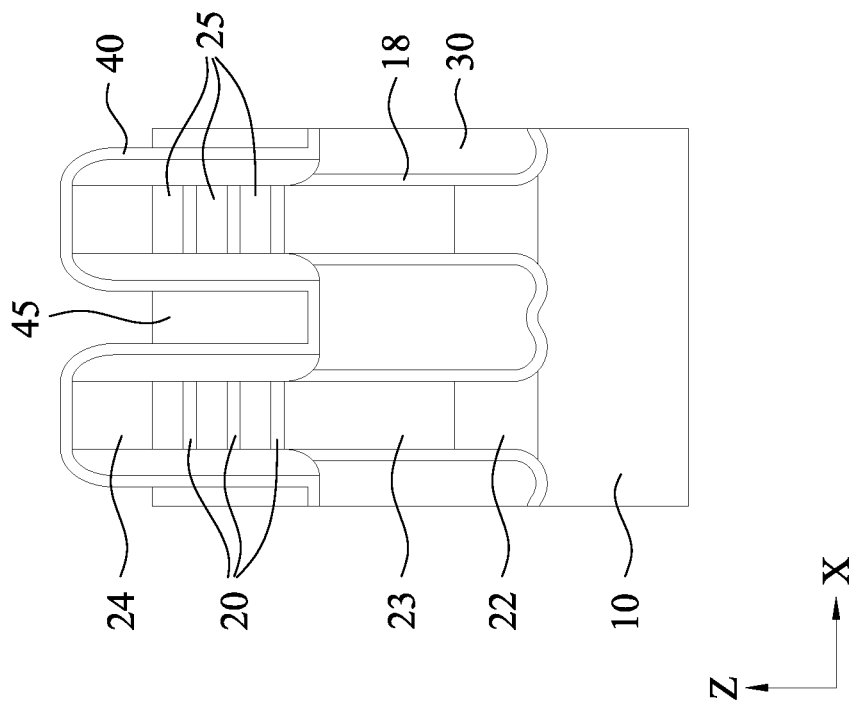

After the second dielectric layer 45 is formed, a planarization operation, such as an etch-back process or a chemical mechanical polishing (CMP) process, is performed to planarize the second dielectric layer 45 and to expose the upper surface of the top semiconductor layer 24. In some embodiments, the top semiconductor layer 24 is slightly etched by about 5 nm to about 10 nm. Further, one or more additional etch-back operations are performed to recess the second dielectric layer 45 as shown in FIG. 8. The second dielectric layer 45 is recessed to a level substantially equal (within ±5 nm) to the interface between the top semiconductor layer 24 and the uppermost one of the second semiconductor layers 25. In some embodiments, subsequently, the first dielectric layer 40 is further trimmed (etched) to expose a part of the sacrificial cladding layer 35.

Figure 9B:
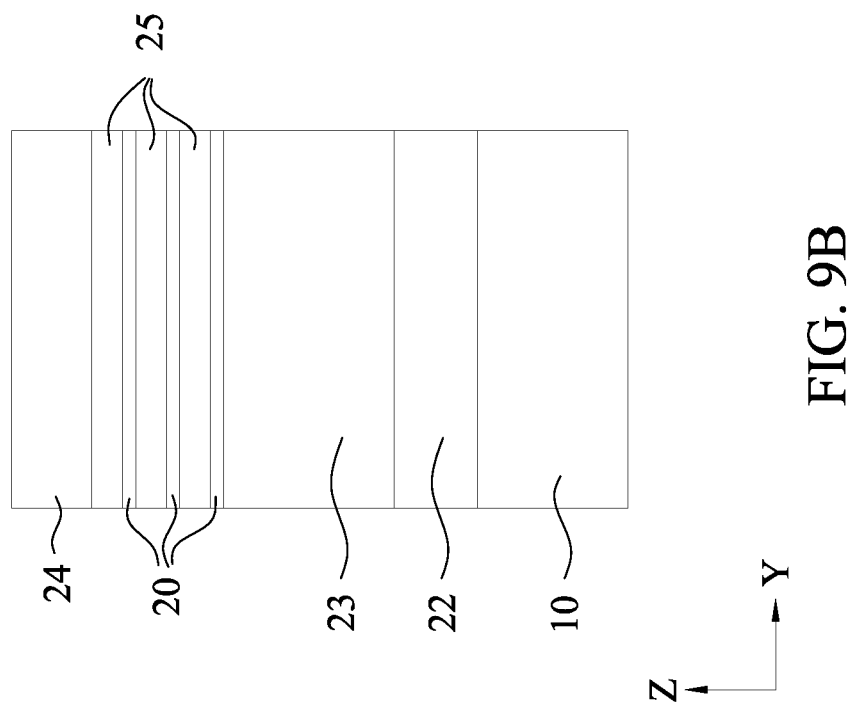
FIGS. 9A, 9B, 9C and 9D show various views of one of the various stages of manufacturing a semiconductor GAA FET device according to an embodiment of the present disclosure.
Figure 9A:
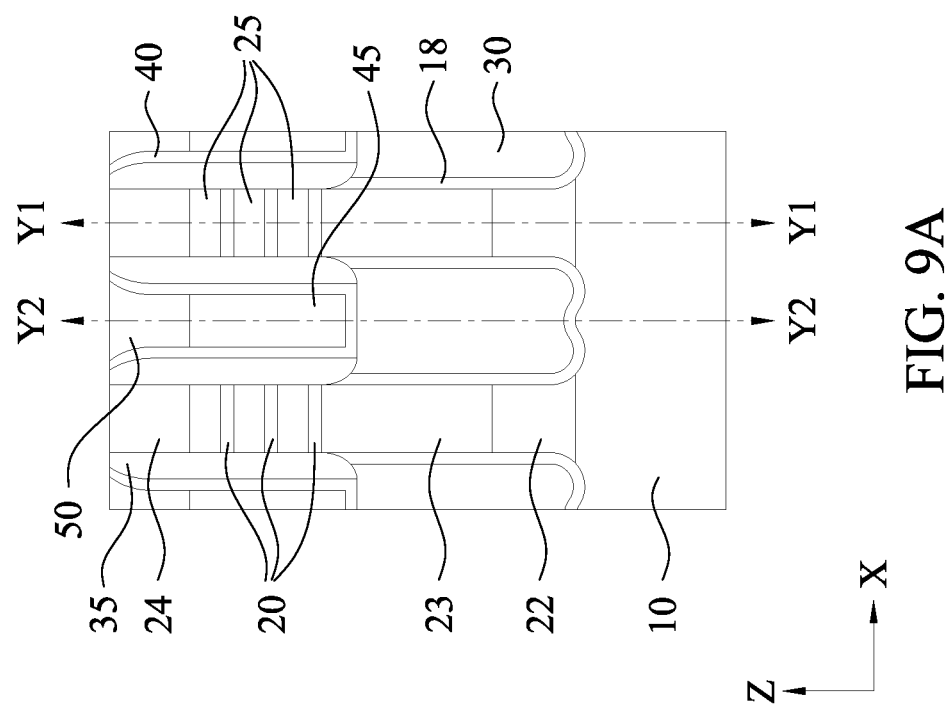
Figure 9D:
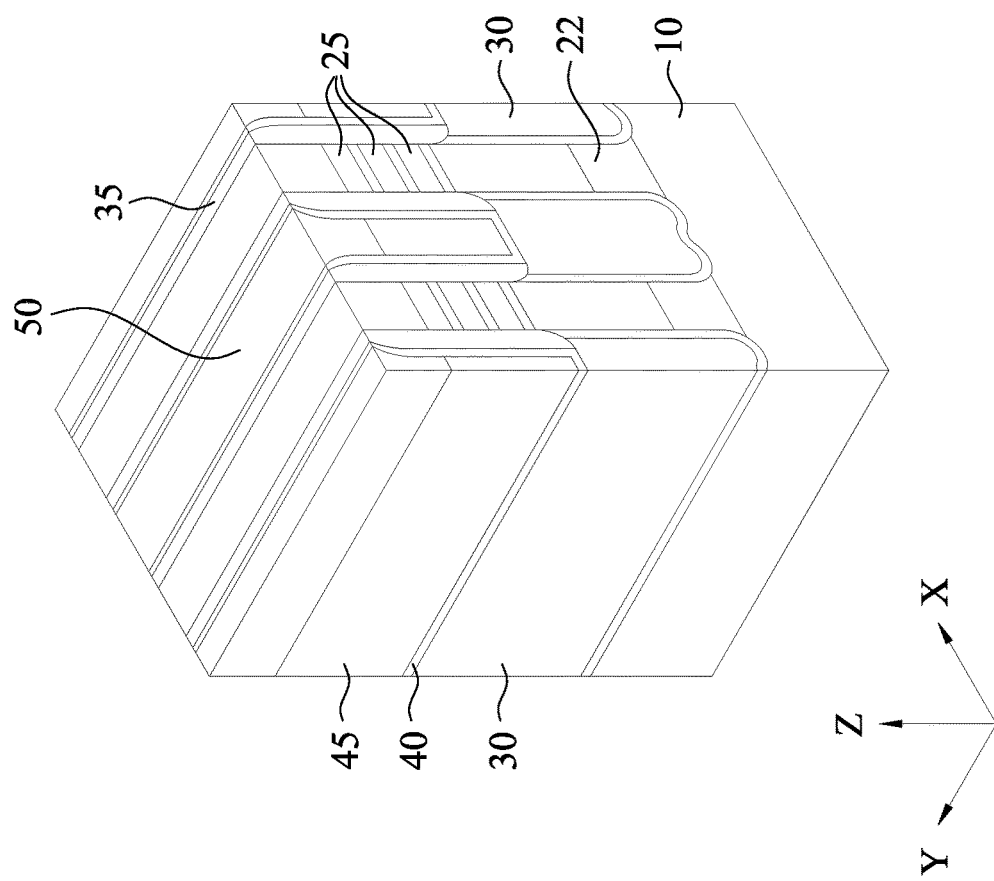
Figure 9C:
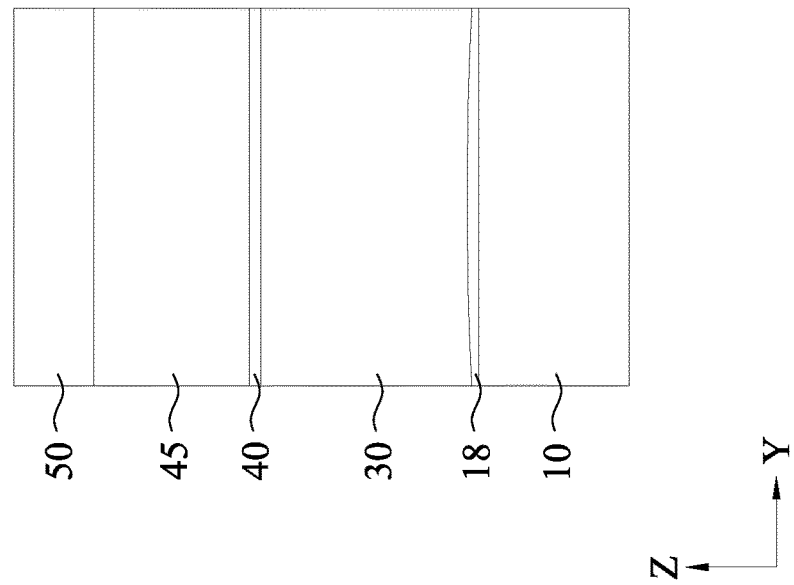

Next, as shown in FIGS. 9A-9D, a third dielectric layer 50 is formed on the recessed second dielectric layer 45. FIG. 9A is a cross sectional view along the X direction, FIG. 9B is a cross sectional view along the Y direction corresponding to line Y1-Y1 of FIG. 9A, FIG. 9C is a cross sectional view along the Y direction corresponding to line Y2-Y2 of FIG. 9A, and FIG. 9D is a isometric view.

The material of the third dielectric layer 50 is different from the materials of the first dielectric layer 40 and the second dielectric layer 45. In some embodiments, the third dielectric layer 45 includes a material having a lower etching rate than the second dielectric layer against a polysilicon or an amorphous SiGe etching. In some embodiments, the third dielectric layer 50 includes a high-k dielectric material. In some embodiments, the third dielectric layer 50 includes a dielectric material having a higher dielectric constant (k) than the second dielectric layer 45 and/or the first dielectric layer 40.

In some embodiments, the third dielectric layer 50 includes one or more of non-doped hafnium oxide (e.g., HfO$_x$, 0<x≤2), hafnium oxide doped with one or more other elements (e.g., HfSiO, HfSiON, HfTaO, HfTiO or HfZrO), zirconium oxide, aluminum oxide, titanium oxide, and a hafnium dioxide-alumina (HfO$_2$—Al$_2$O$_3$) alloy. In certain embodiments, hafnium oxide (HfO$_x$) is used as the third dielectric layer 50. The third dielectric layer 50 can be formed by LPCVD, plasma-CVD or ALD, or any other suitable film formation method. As shown in FIG. 9A, the third dielectric layer 50 fully fills the space between adjacent fin structures. After the third dielectric layer 50 is formed to fully cover the fin structures, a planarization operation, such as an etch-back process or a CMP process, is performed to planarize the upper surface of the third dielectric layer 50 to expose the upper surface of the top semiconductor layer 24, as shown in FIGS. 9A-9D. In some embodiments, the thickness of the third dielectric layer 50 remaining on the top semiconductor layer 24 is in a range from about 5 nm to about 100 nm, the width of the third dielectric layer 50 at the top thereof is in a range from about 10 nm to about 80 nm, depending on device and/or process requirements. Accordingly, a wall fin structure is formed by layers 40, 45 and 50 between adjacent fin structures. After the wall fin structure is formed, an annealing operation at a temperature of about 800° C. to about 1000° C. is performed for about 10 sec to about 60 sec, in some embodiments.

Figure 10B:
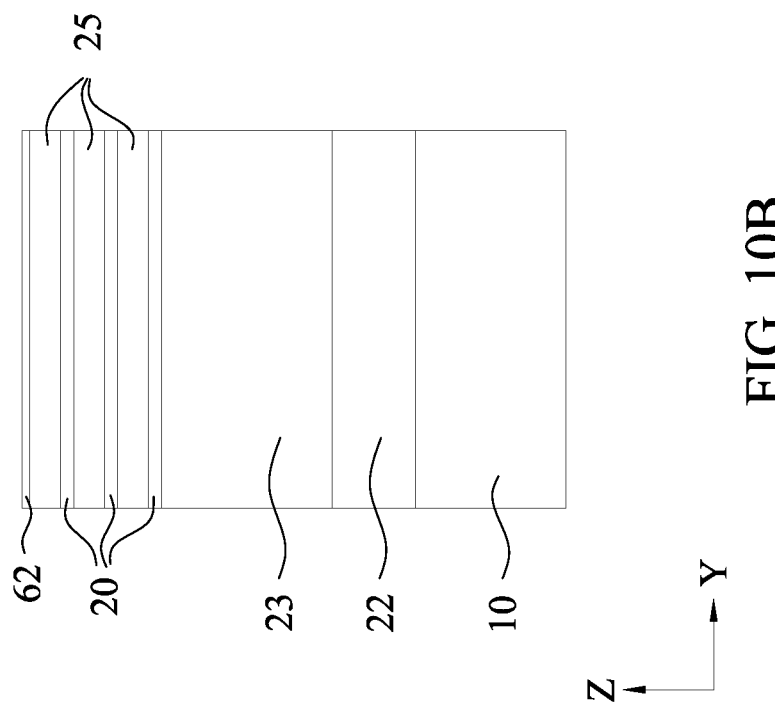
FIGS. 10A, 10B and 10C show various views of one of the various stages of manufacturing a semiconductor GAA FET device according to an embodiment of the present disclosure.
Figure 10A:
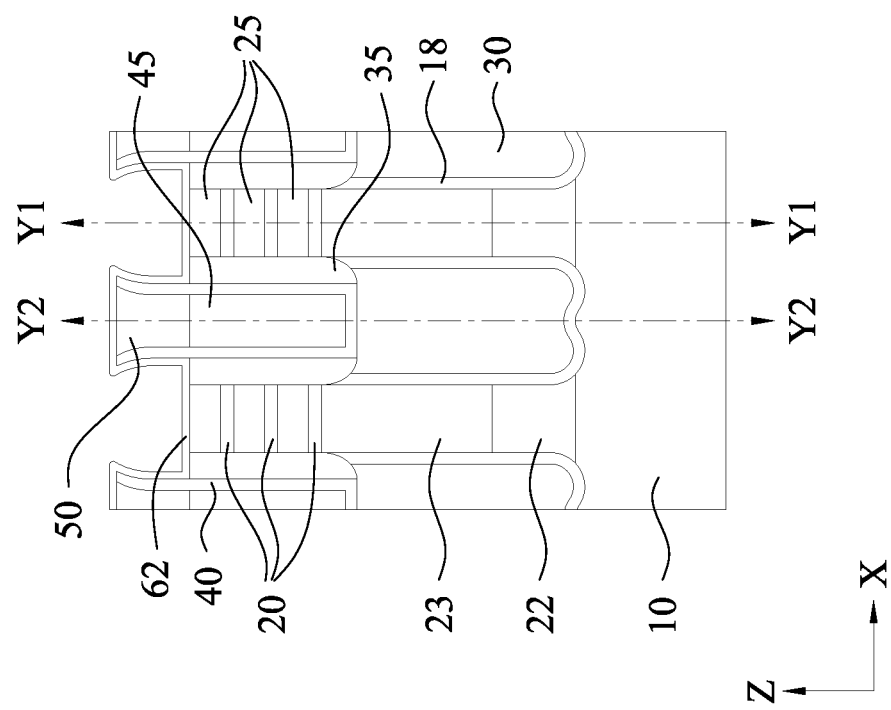
Figure 10C:
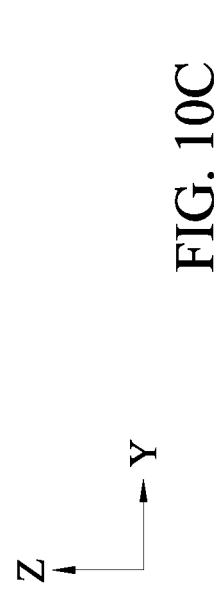

Then, as shown in FIGS. 10A-10C, the top semiconductor layer 24 is removed by one or more dry or wet etching operations. In FIGS. 10A-10C to 21A-21C, the "B" figures are cross sectional views along the Y direction corresponding to line Y1-Y1 of the "A" figures, and the "C" figures are cross sectional view along the Y direction corresponding to line Y2-Y2 of the "A" figures. As shown in FIG. 10A, a groove having sidewalls formed by the cladding layers 35 is formed. After the top semiconductor layer 24 is removed, a sacrificial gate dielectric layer 62 is formed on the uppermost one of the second semiconductor layers 25, the sidewalls of the first dielectric layer, and on the third dielectric layer 50 as shown in FIGS. 10A-10C. The sacrificial gate dielectric layer 62 includes one or more layers of insulating material, such as a silicon oxide-based material. In one embodiment, silicon oxide formed by CVD is used. The thickness of the sacrificial gate dielectric layer 62 is in a range from about 1 nm to about 5 nm in some embodiments.

Figure 11A:
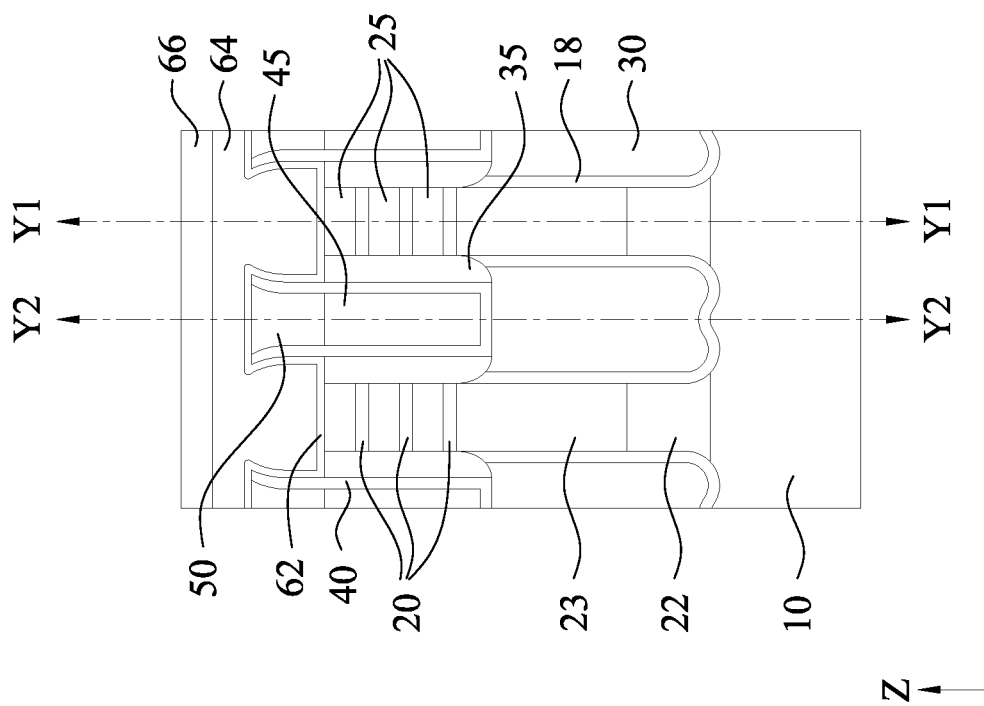
FIGS. 11A, 11B and 11C show various views of one of the various stages of manufacturing a semiconductor GAA FET device according to an embodiment of the present disclosure.
Figure 11C:
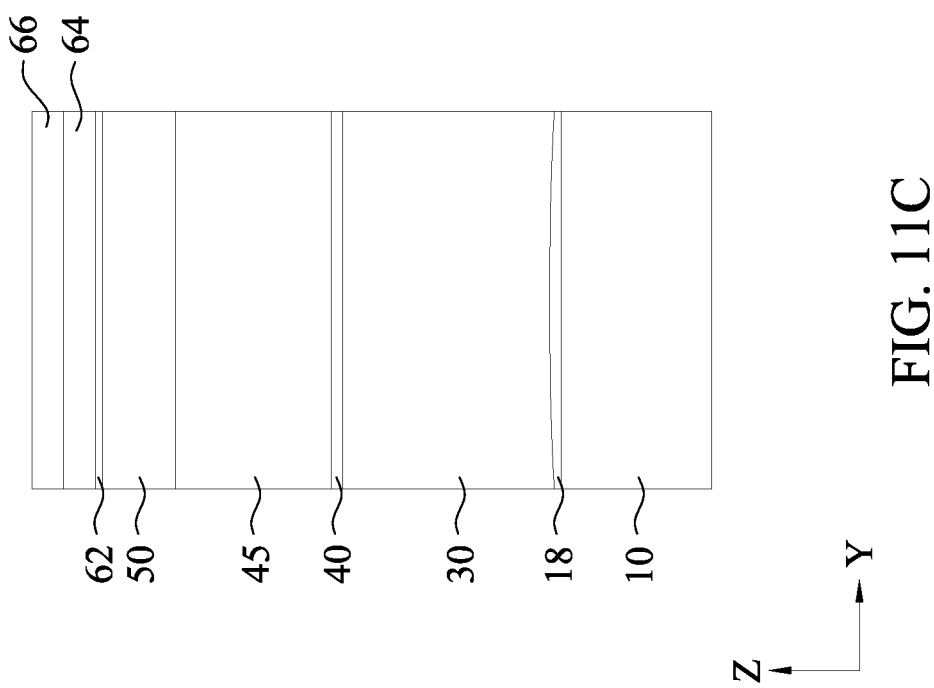
Figure 11B:
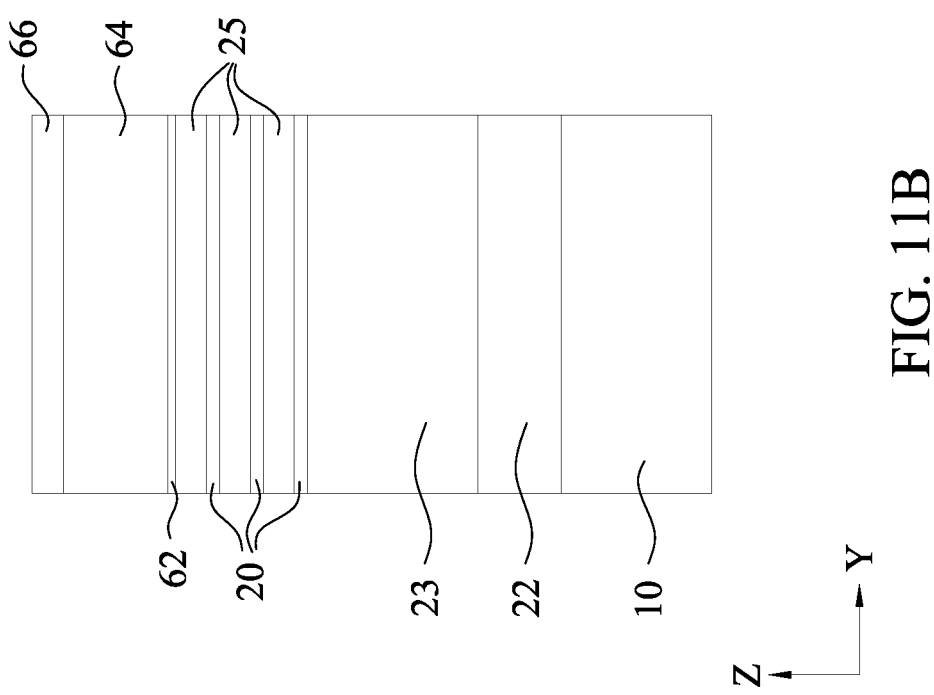

Further, as shown in FIGS. 11A-11C, a sacrificial (dummy) gate electrode layer 64 is formed, and a hard mask layer 66 is formed on the sacrificial gate electrode layer 64. The sacrificial gate electrode layer 64 is blanket deposited on the sacrificial gate dielectric layer 62 and over the third dielectric layer 50, such that the third dielectric layer 50 is fully embedded in the sacrificial gate electrode layer 64. The sacrificial gate electrode layer 64 includes silicon such as polycrystalline silicon or amorphous silicon. The thickness of the sacrificial gate electrode layer 64 is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, the hard mask layer 66 is formed over the sacrificial gate electrode layer. The hard mask layer 66 includes one or more layers of silicon nitride or silicon oxide.

Figure 12B:
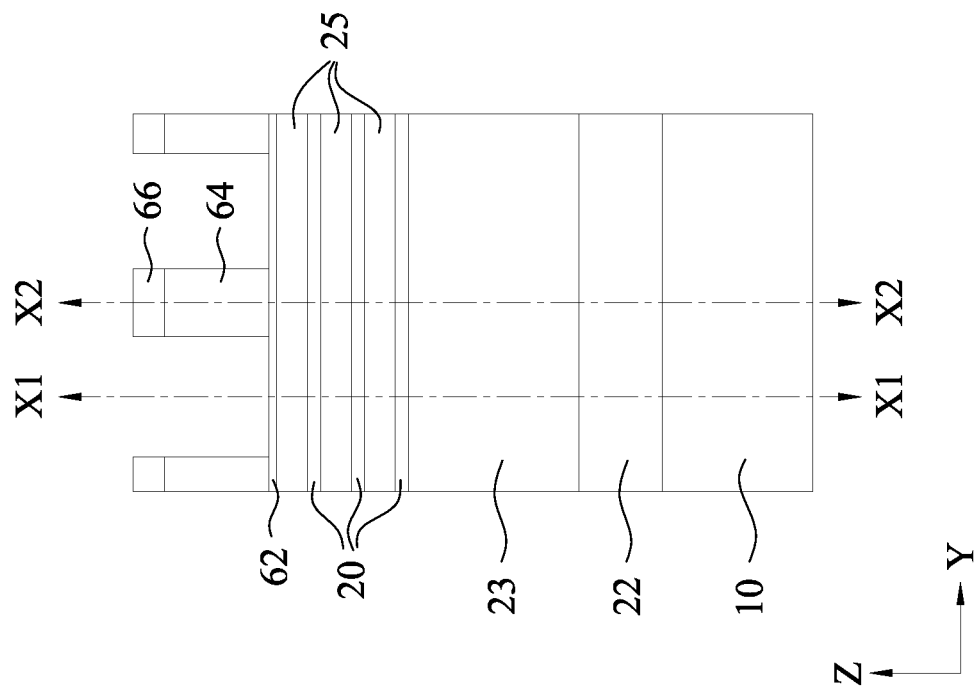
FIGS. 12A, 12B and 12C show various views of one of the various stages of manufacturing a semiconductor GAA FET device according to an embodiment of the present disclosure.
Figure 12A:
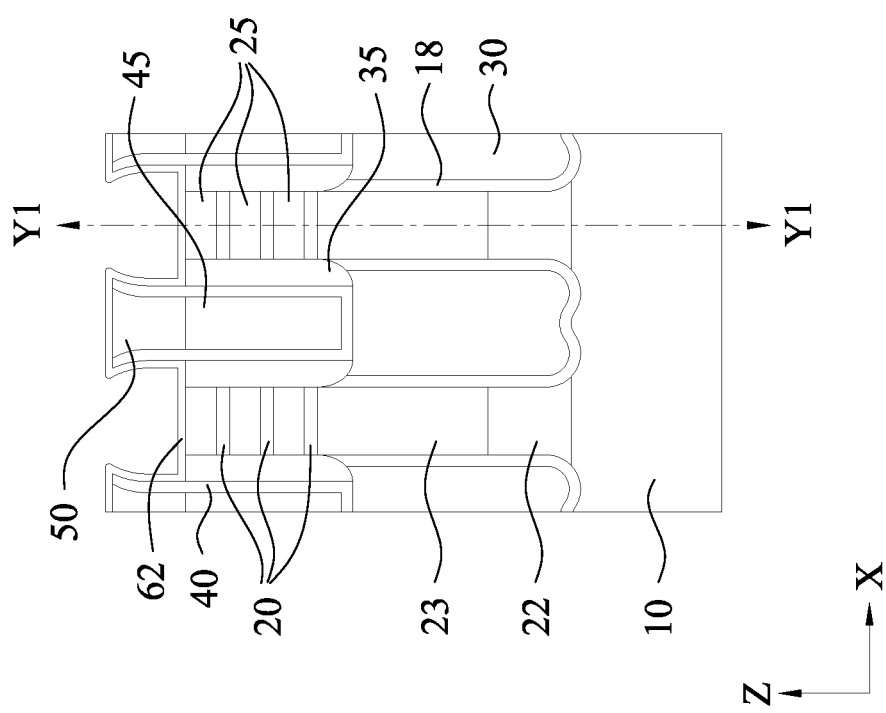
Figure 12C:
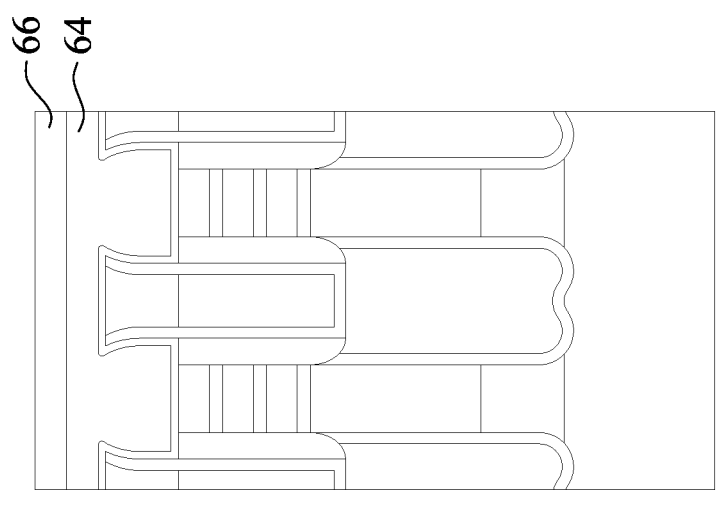

Next, a patterning operation is performed on the hard mask layer 66 and the sacrificial gate electrode layer 64 is patterned into sacrificial gate electrodes, as shown in FIGS. 12A-12C. In some embodiments, the width of the sacrificial gate electrode 64 is in a range from about 5 nm to about 30 nm and is in a range from about 10 nm to about 20 nm. Two or more sacrificial gate electrodes are arranged in the Y direction in some embodiments. In certain embodiments, one or more dummy sacrificial gate electrodes are formed on both sides of the sacrificial gate electrodes to improve pattern fidelity.

Figure 13B:
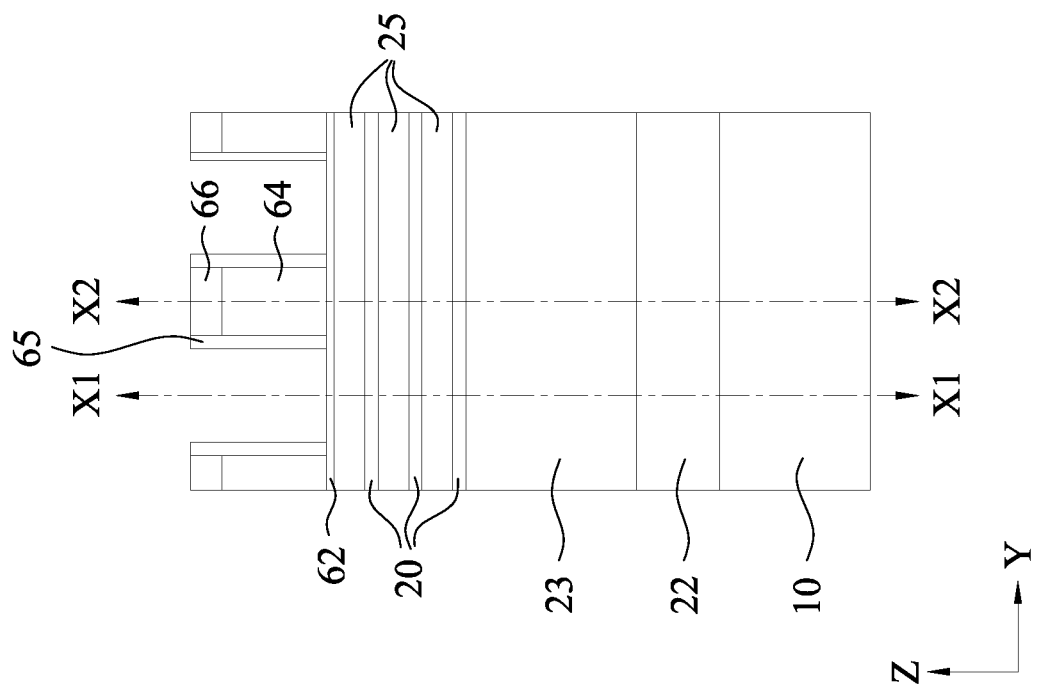
FIGS. 13A, 13B, 13C and 13D show various views of one of the various stages of manufacturing a semiconductor GAA FET device according to an embodiment of the present disclosure.
Figure 13A:
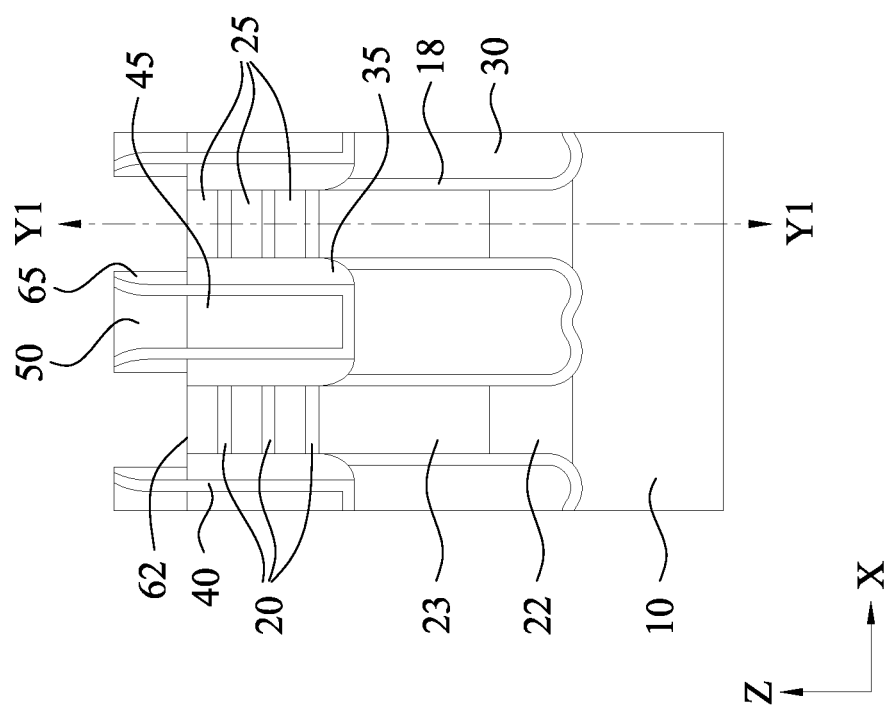
Figure 13D:
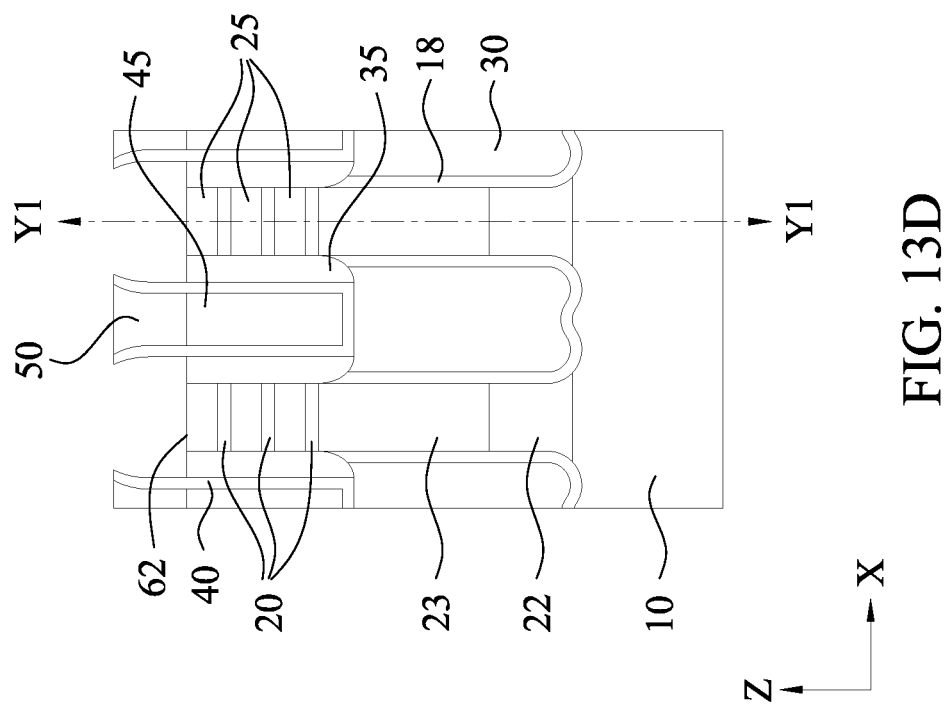
Figure 13C:
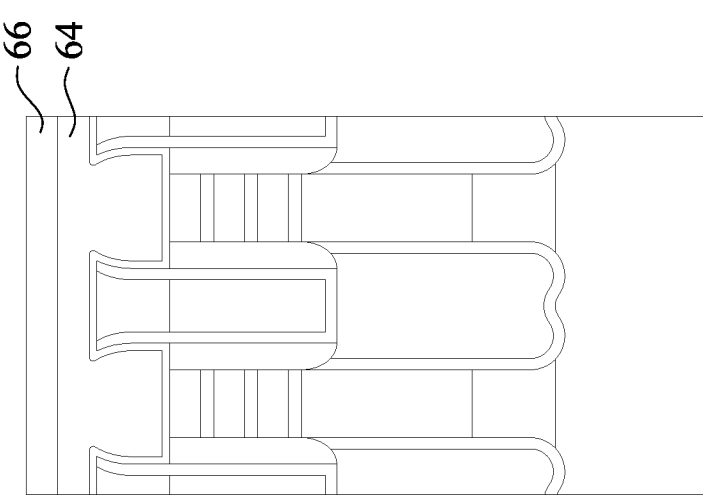

Further, sidewall spacers 65 are formed over the sacrificial gate electrodes 64, as shown in FIGS. 13A-13C. One or more insulating layers are deposited in a conformal manner to have substantially equal thicknesses on vertical surfaces, such as the sidewalls, horizontal surfaces, and the top of the sacrificial gate electrode and the sidewalls by the first dielectric layer 40, respectively. Then, by using anisotropic etching, the sidewall spacers 65 are formed. In some embodiments, the sidewall spacer has a thickness in a range from about 3 nm to about 20 nm. The sidewall spacers 65 include one or more of silicon nitride, SiON, SiCN, SiCO, SiOCN or any other suitable dielectric material. In some embodiments, since the height of the third dielectric layer 50 is much smaller than the height of the sacrificial gate electrode layer 64 with the hard mask layer, the thickness of the sidewall spacers on sidewalls of the first dielectric layer which is on the third dielectric layer 50 is smaller than the thickness of the sidewall spacers on the sacrificial gate electrode 64, or no sidewall spacer is formed on sidewalls of the first dielectric layer which is on the third dielectric layer 50 as shown in FIG. 13D.

Figure 14B:
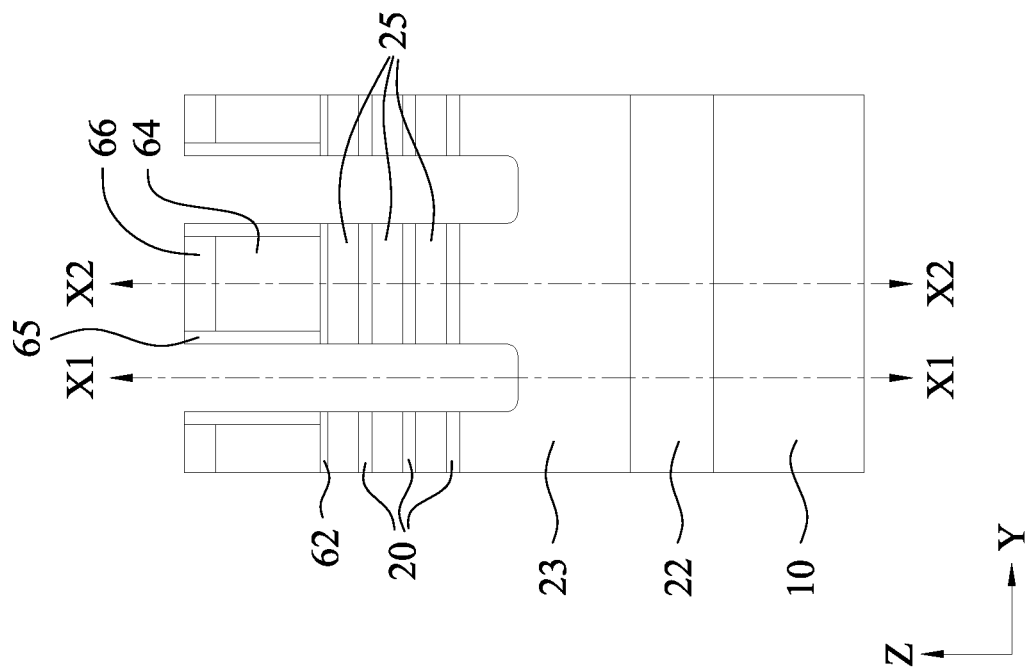
FIGS. 14A, 14B and 14C show various views of one of the various stages of manufacturing a semiconductor GAA FET device according to an embodiment of the present disclosure.
Figure 14A:
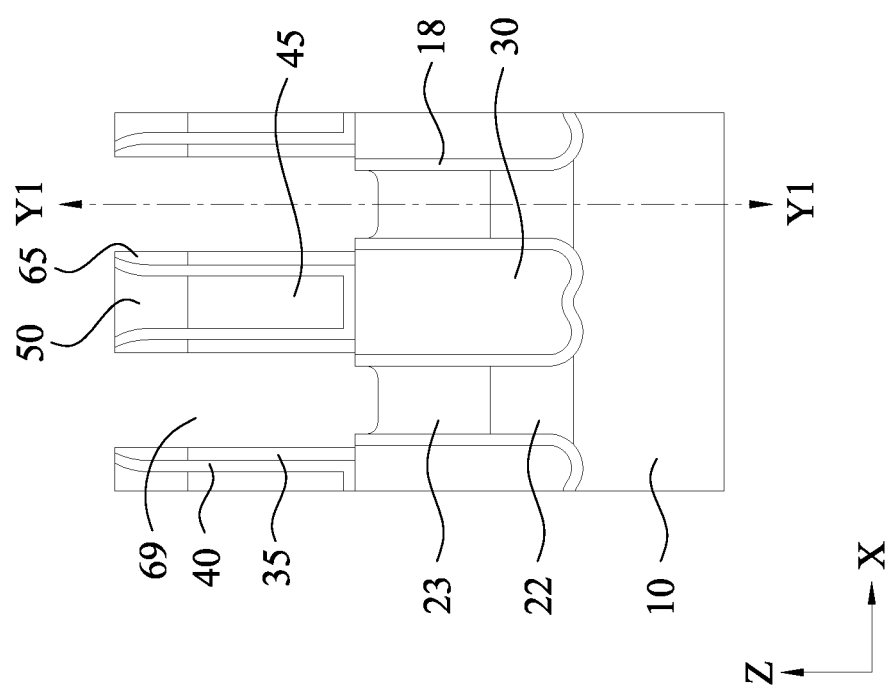

Then, the stacked structure of the first semiconductor layers 20 and the second semiconductor layer 25 is etched down at the source/drain regions, by using one or more etching operations, thereby forming a source/drain space 69, as shown in FIGS. 14A-14B. In some embodiments, the second bottom semiconductor layer 23 is also partially etched. In some embodiments, during the etching, the sacrificial cladding layer 35 is partially or fully removed. In some embodiments, when no or thin sidewall spacer is formed on sidewalls of the first dielectric layer which is on the third dielectric layer 50, the sacrificial cladding layer 35 is also removed during the etching to form the source/drain space 69.

Figure 15A:
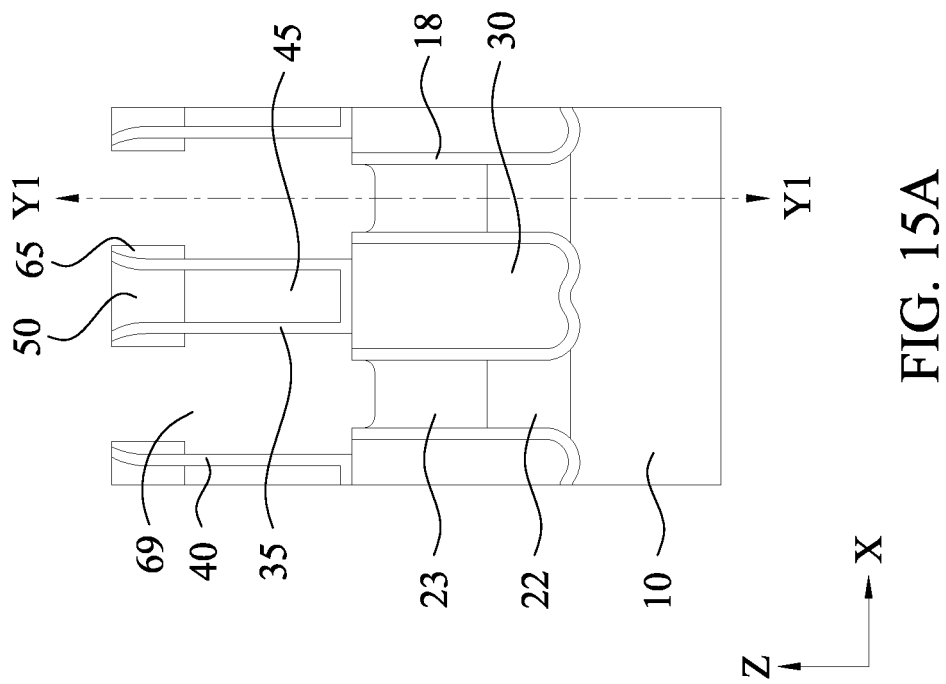
FIGS. 15A, 15B and 15C show various views of one of the various stages of manufacturing a semiconductor GAA FET device according to an embodiment of the present disclosure.
Figure 14C:
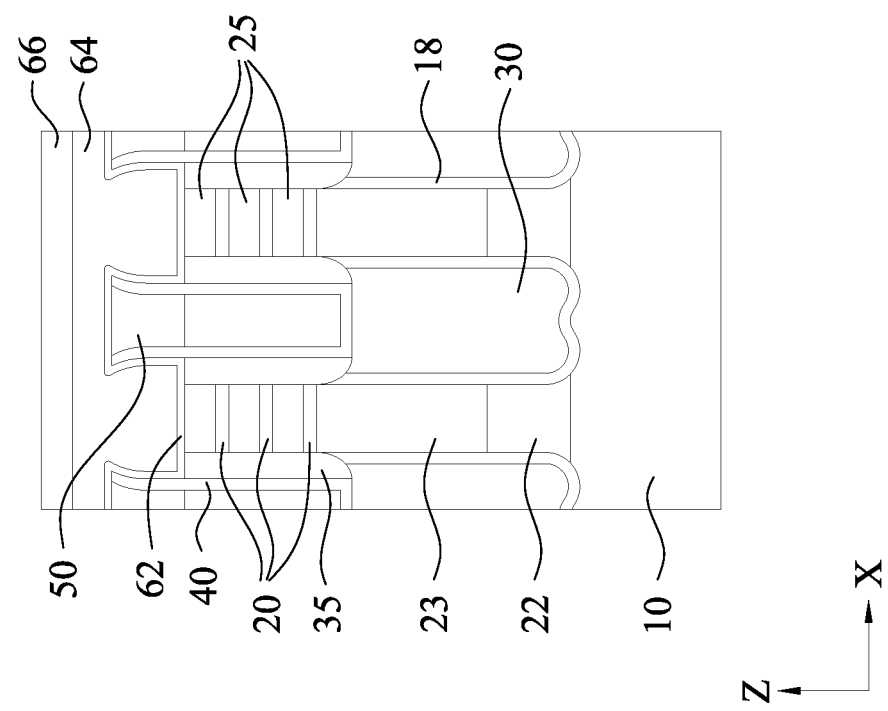
Figure 15C:
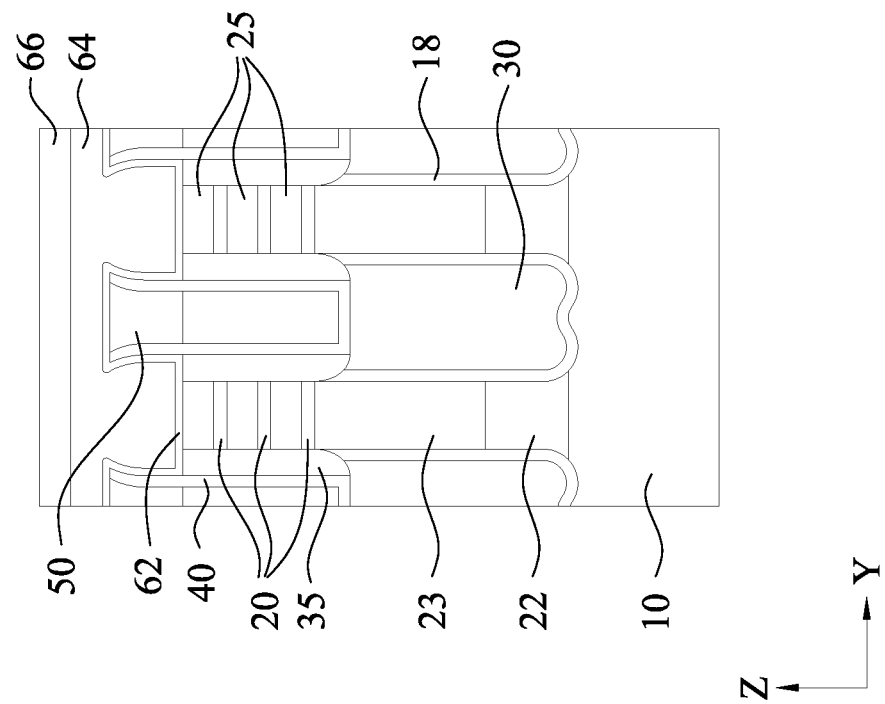
Figure 15B:
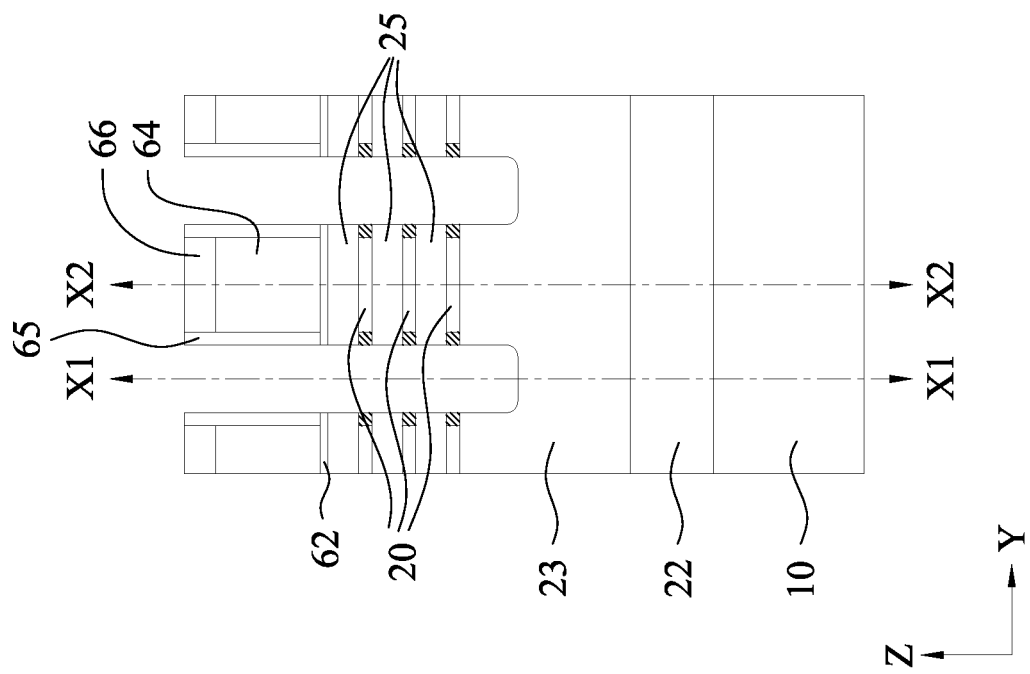

Further, inner spacers are formed a shown in FIGS. 15A-15C. The first semiconductor layers 20 are laterally etched in the Y direction within the source/drain space 69, thereby forming cavities. The lateral amount of etching of the first semiconductor layer 20 is in a range from about 0.5 nm to about 10 nm in some embodiments, and is in a range from about 1 nm to about 5 nm in other embodiments.

When the first semiconductor layers 20 are SiGe and the second semiconductor layers 25 are Si, the first semiconductor layers 20 can be selectively etched by isotropic etching, such as wet etching. A wet etchant includes a mixed solution of $H_2O_2$, $CH_3COOH$ and HF, followed by $H_2O$ cleaning in some embodiments. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments.

Then, a fourth dielectric layer is conformally formed on the etched lateral ends of the first semiconductor layers 20 and on end faces of the second semiconductor layers 25 in the source/drain space 69. The fourth dielectric layer includes one of silicon nitride and silicon oxide, SiON, SiOC, SiCN and SiOCN, or any other suitable dielectric material. The fourth dielectric layer is made of a different material than the sidewall spacers 65 in some embodiments. The fourth dielectric layer can be formed by ALD or any other suitable methods.

After the fourth dielectric layer is formed, an etching operation is performed to partially remove the fourth dielectric layer, thereby forming inner spacers 70, as shown in FIG. 15B. In some embodiments, the end face of the inner spacers 70 is recessed more than the end face of the second semiconductor layers 25. The recessed amount is in a range from about 0.2 nm to about 3 nm and in in a range from about 0.5 nm to about 2 nm in other embodiments. In other embodiments, the recessed amount is less than 0.5 nm and may be equal to zero (the end face of the inner spacer 70 and the end face of the second semiconductor layers 25 are flush with each other). In some embodiments, before forming the fourth dielectric layer, an additional dielectric layer having a smaller thickness than the fourth dielectric layer is formed, and thus the inner spacers 70 have a two-layer structure.

Figure 16B:
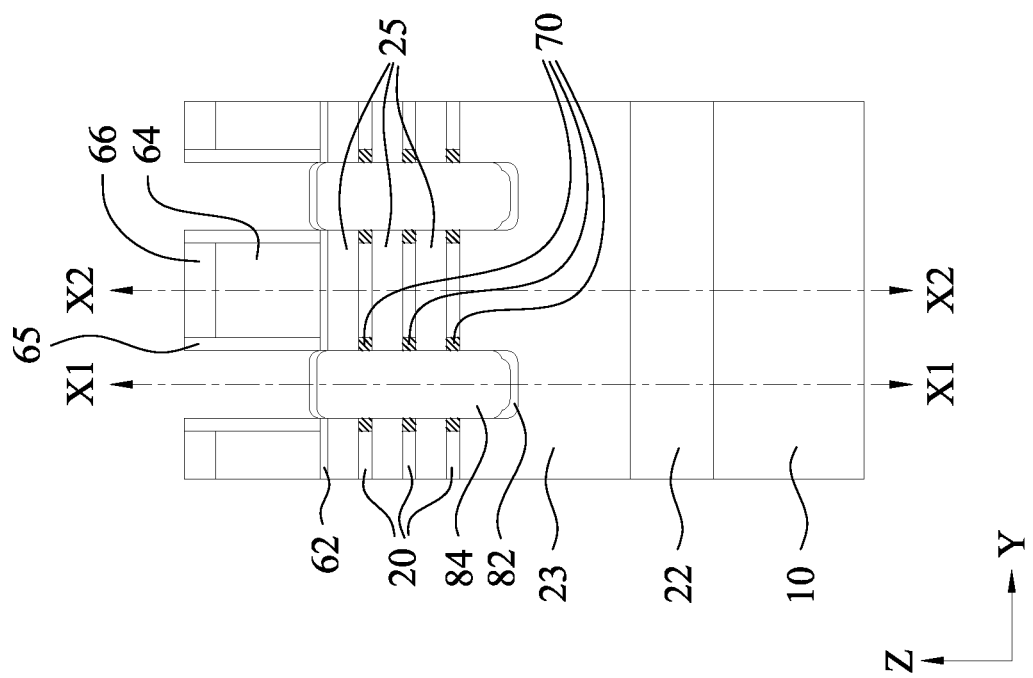
FIGS. 16A, 16B and 16C show various views of one of the various stages of manufacturing a semiconductor GAA FET device according to an embodiment of the present disclosure.
Figure 16A:
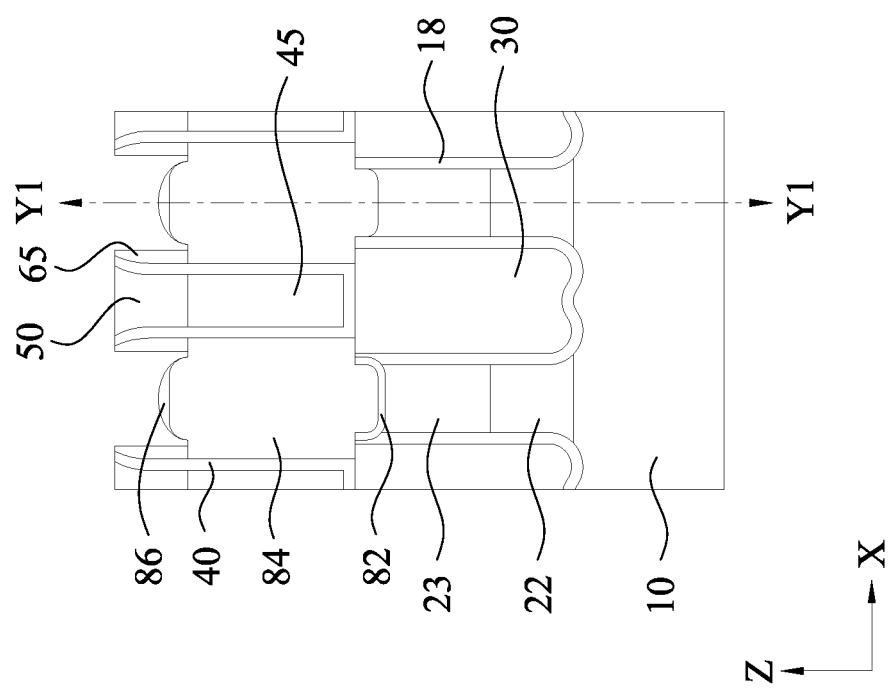
Figure 16C:
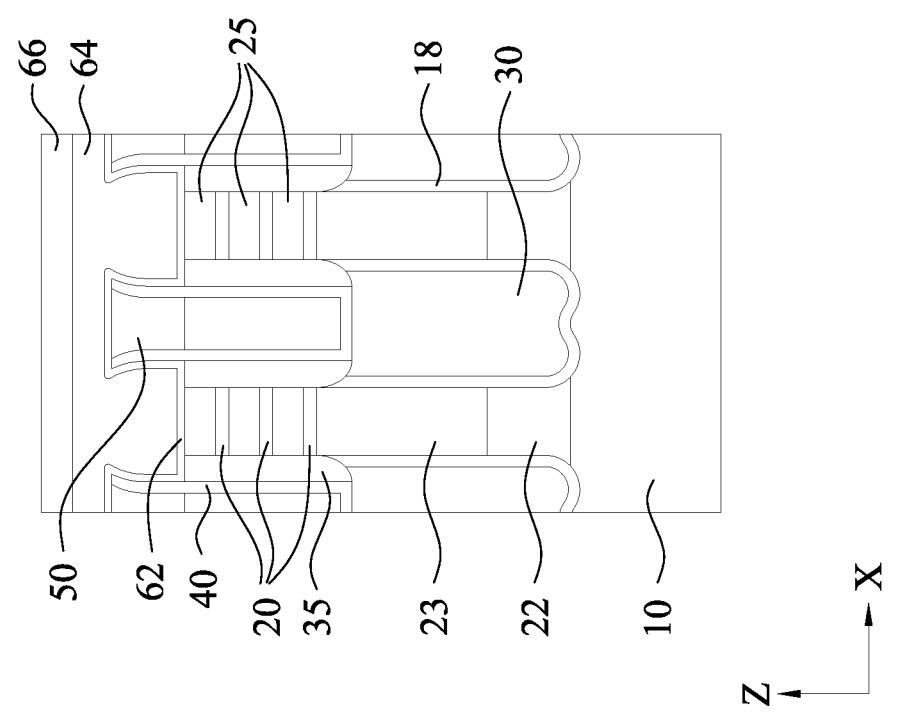

Subsequently, as shown in FIGS. 16A-16C, a source/drain epitaxial layer is formed in the source/drain space 69. The source/drain epitaxial layer includes one or more layers of SiP, SiAs, SiCP, SiPAs and/or SiC for an n-type FET, and SiGe, GeSn and/or SiGeSn for a p-type FET. For the p-type FET, the source/drain epitaxial layer is doped with B (boron) in some embodiments. In some embodiments, the source/drain epitaxial layer includes multiple layers.

In some embodiments, the source/drain epitaxial layer of an n-type FET includes a first epitaxial layer 82, a second epitaxial layer 84 and a third epitaxial layer 86. In some embodiments, the first epitaxial layer 82 is made of SiP, SiAs or SiAs:P or combination thereof. In some embodiments, the P concentration of the first epitaxial layer 82 is in a range from about $0.5 \times 10^{19}$ atoms/cm$^3$ to about $5 \times 10^{20}$ atoms/cm$^3$, and is in a range from about $0.8 \times 10^{19}$ atoms/cm$^3$ to about $2 \times 10^{20}$ atoms/cm$^3$ in other embodiments. In some embodiments, the second epitaxial layer 84 is made of SiP. In some embodiments, the P concentration of the second epitaxial layer 84 is higher than that of the first SiP epitaxial layer 82, and is in a range from about $1 \times 10^{21}$ atoms/cm$^3$ to about $5 \times 10^{21}$ atoms/cm$^3$, and is in a range from about $2 \times 10^{21}$ atoms/cm$^3$ to about $4 \times 10^{21}$ atoms/cm$^3$ in other embodiments. In some embodiments, the third epitaxial layer 86 is made of SiGeP. In some embodiments, the P concentration of the third epitaxial layer 86 is equal to or lower than that of the second SiP epitaxial layer 84 and higher than that of the first SiP epitaxial layer 82, and is in a range from about $0.5 \times 10^{21}$ atoms/cm$^3$ to about $4 \times 10^{21}$ atoms/cm$^3$, and is in a range from about $1 \times 10^{21}$ atoms/cm$^3$ to about $3 \times 10^{21}$ atoms/cm$^3$ in other embodiments. In some embodiments, the Ge concentration of the third epitaxial layer 86 is in a range from about 0.5 atomic % to 10 atomic %, and is in a range from about 1 atomic % to about 5 atomic % in other embodiments.

In some embodiments, the source/drain epitaxial layer of a p-type FET includes a first epitaxial layer 82, a second epitaxial layer 84 and a third epitaxial layer 86. In some embodiments, the first epitaxial layer 82 is made of SiGe doped with B. In some embodiments, the Ge content is in a range from about 15 atomic % to about 30 atomic %. In some embodiments, the B concentration of the first epitaxial layer 82 is in a range from about $1\times10^{19}$ atoms/cm$^3$ to about $1\times10^{21}$ atoms/cm$^3$, and is in a range from about $5\times10^{19}$ atoms/cm$^3$ to about $5\times10^{20}$ atoms/cm$^3$ in other embodiments. In some embodiments, the second epitaxial layer 84 is made of SiGe doped with B. In some embodiments, the Ge content of the second epitaxial layer 84 is in a range from about 20 atomic % to about 35 atomic % in some embodiments. In some embodiments, the B concentration of the second epitaxial layer 84 is equal to or higher than the largest B concentration of the first epitaxial layer 82, and is in a range from about $0.5\times10^{20}$ atoms/cm$^3$ to about $1\times10^{21}$ atoms/cm$^3$, and is in a range from about $1\times10^{20}$ atoms/cm$^3$ to about $5\times10^{20}$ atoms/cm$^3$ in other embodiments. In some embodiments, the third epitaxial layer 86 is made of SiGe doped with B. In some embodiments, the Ge content is in a range from 25 atomic % to about 60 atomic %. In some embodiments, the average Ge content of the third epitaxial layer is greater than the Ge content of the second epitaxial layer. In some embodiments, the B concentration of the third epitaxial layer 86 is in a range from about $5\times10^{19}$ atoms/cm$^3$ to about $5\times10^{21}$ atoms/cm$^3$, and is in a range from about $1\times10^{20}$ atoms/cm$^3$ to about $3\times10^{21}$ atoms/cm$^3$ in other embodiments.

The source/drain epitaxial layers are formed by an epitaxial growth method using CVD, ALD or molecular beam epitaxy (MBE).

Figure 17A:
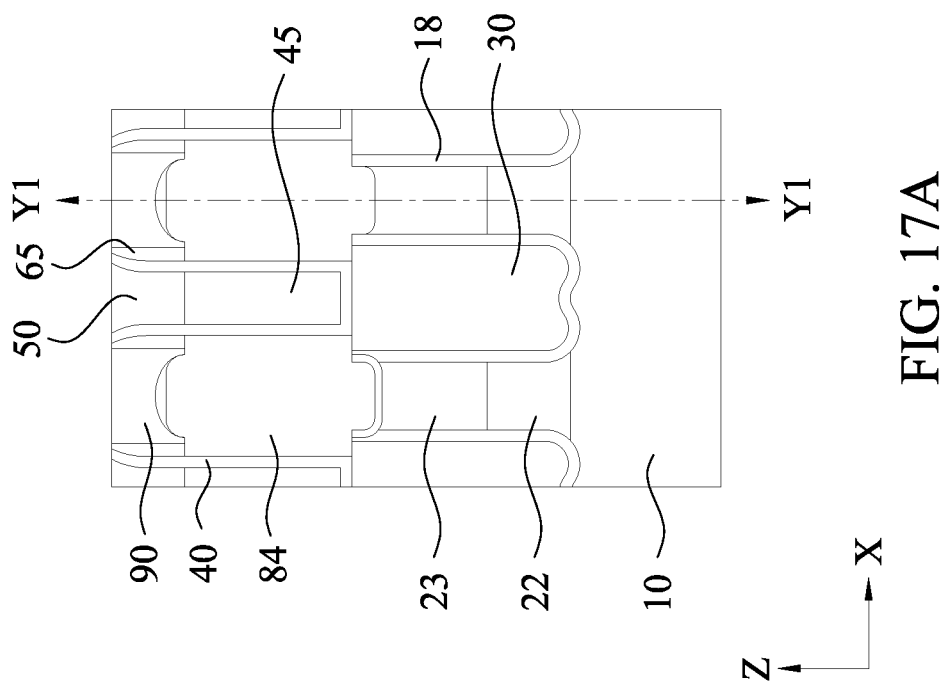
FIGS. 17A, 17B and 17C show various views of one of the various stages of manufacturing a semiconductor GAA FET device according to an embodiment of the present disclosure.
Figure 17C:
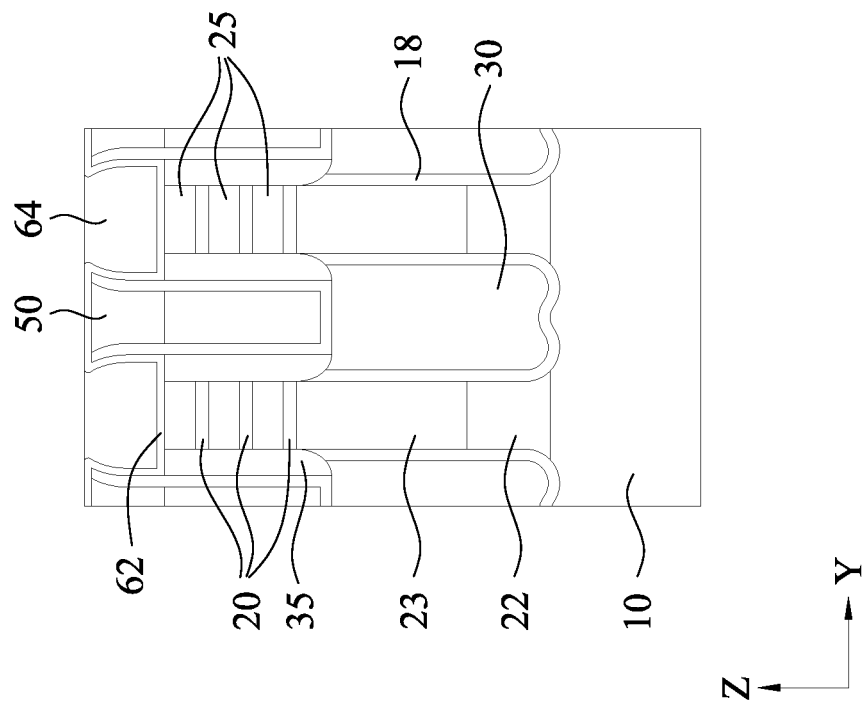
Figure 17B:
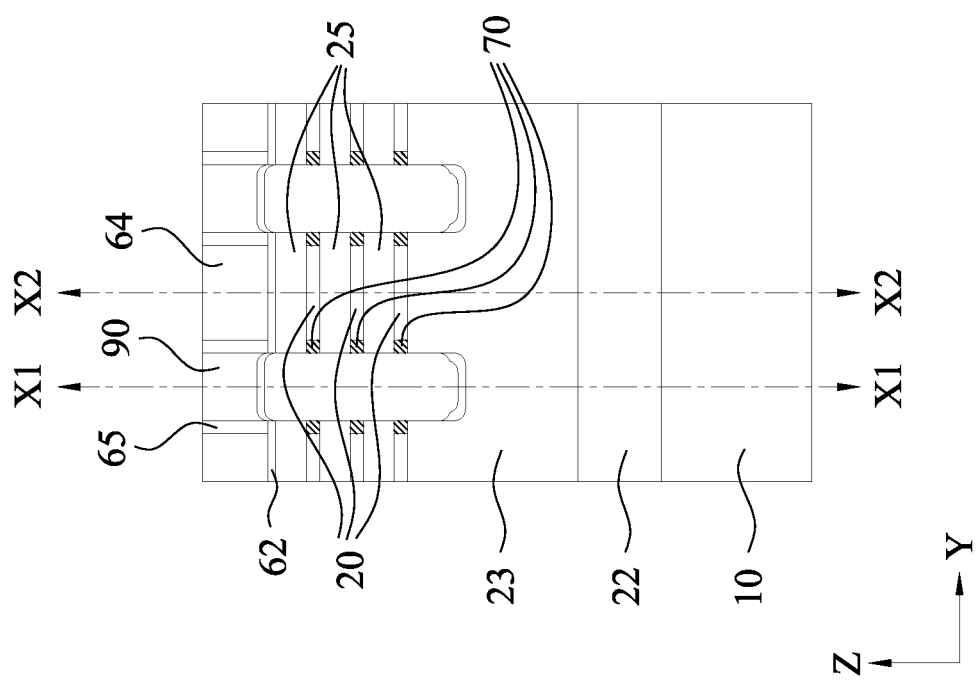

After the source/drain epitaxial layers are formed, a fifth dielectric layer 90 is formed over the source/drain epitaxial layers, as shown in FIGS. 17A-17C. The fifth dielectric layer 90 includes one of silicon nitride and silicon oxide, SiON, SiOC, SiCN and SiOCN, or any other suitable dielectric material. Then, one or more planarization operations, such as a CMP operation, are performed to expose the upper surface of the sacrificial gate electrode 64 as shown in FIGS. 17B and 17C.

Figure 18B:
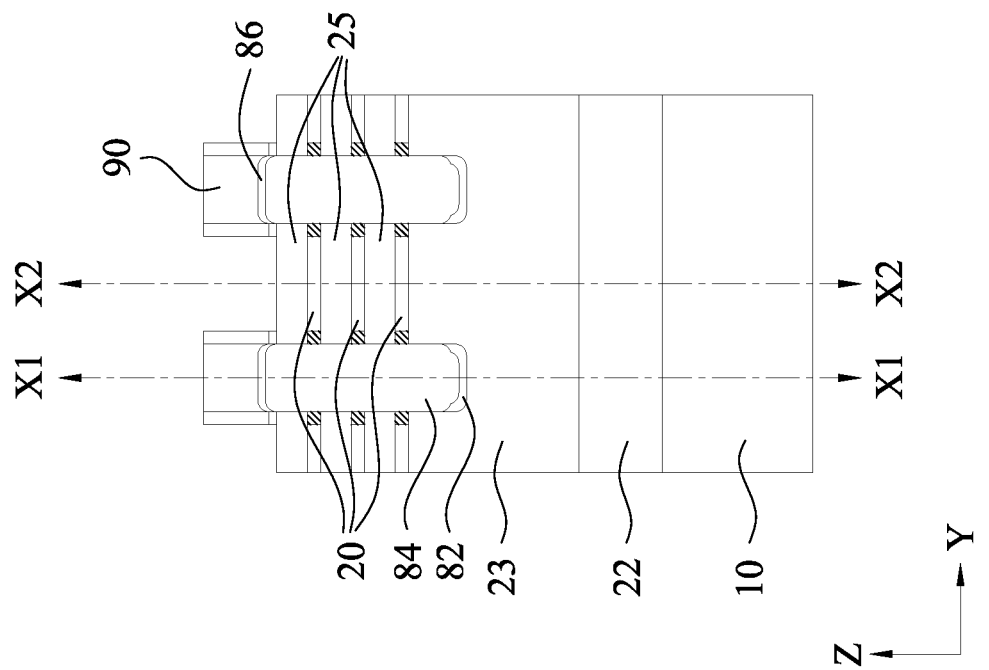
FIGS. 18A, 18B and 18C show various views of one of the various stages of manufacturing a semiconductor GAA FET device according to an embodiment of the present disclosure.
Figure 18A:
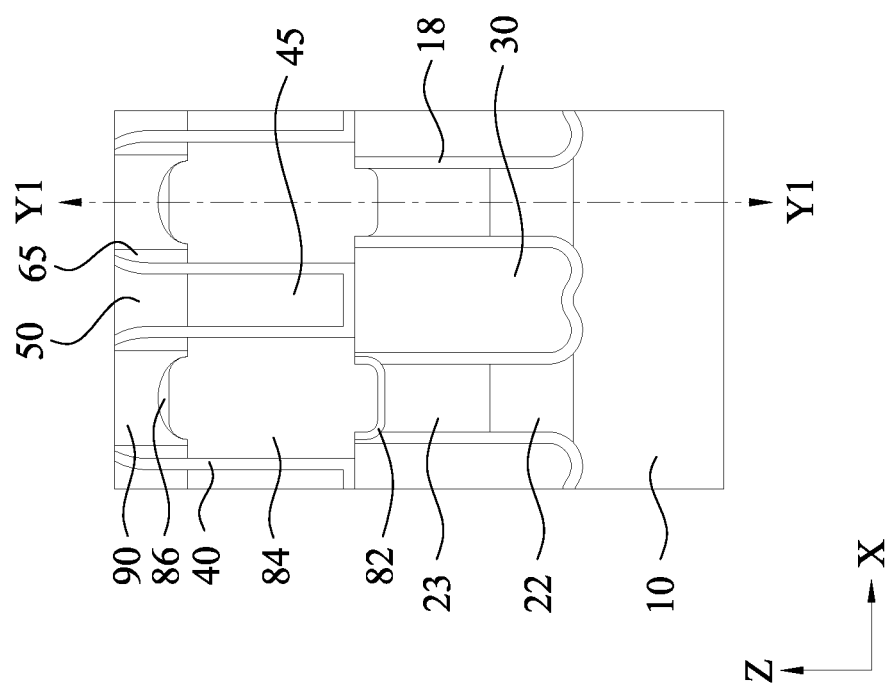
Figure 18C:
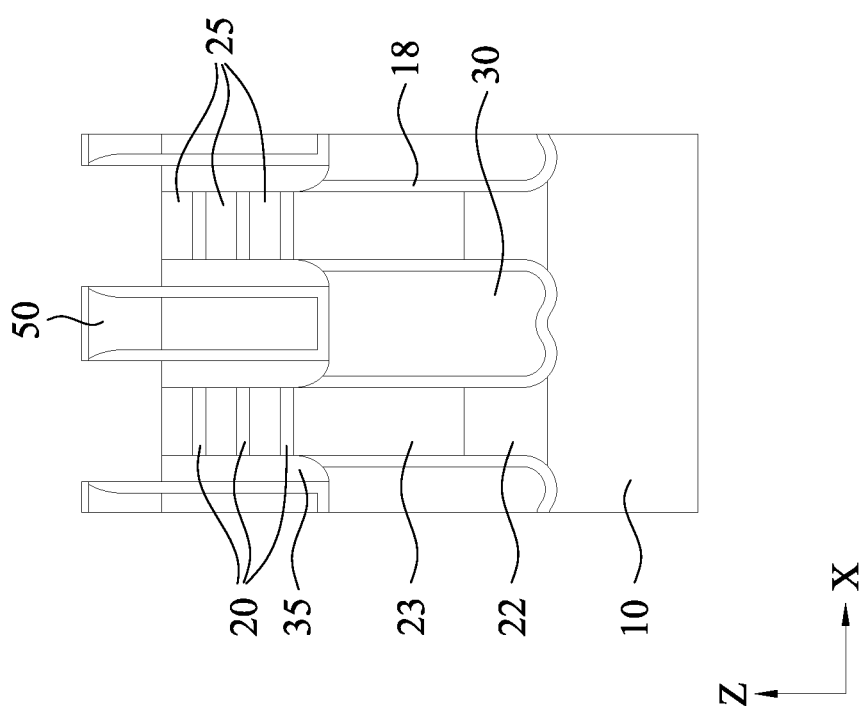

Then, the sacrificial gate electrode 64 and sacrificial gate dielectric layer 62 are removed as shown in FIGS. 18A-18C. The fourth dielectric layer 90 protects the source/drain epitaxial layers during the removal of the sacrificial gate structures. The sacrificial gate structures can be removed using plasma dry etching and/or wet etching. When the sacrificial gate electrode 64 is polysilicon, a wet etchant such as a TMAH solution can be used to selectively remove the sacrificial gate electrode 64. The sacrificial gate dielectric layer 62 is thereafter removed using plasma dry etching and/or wet etching.

Figure 19A:
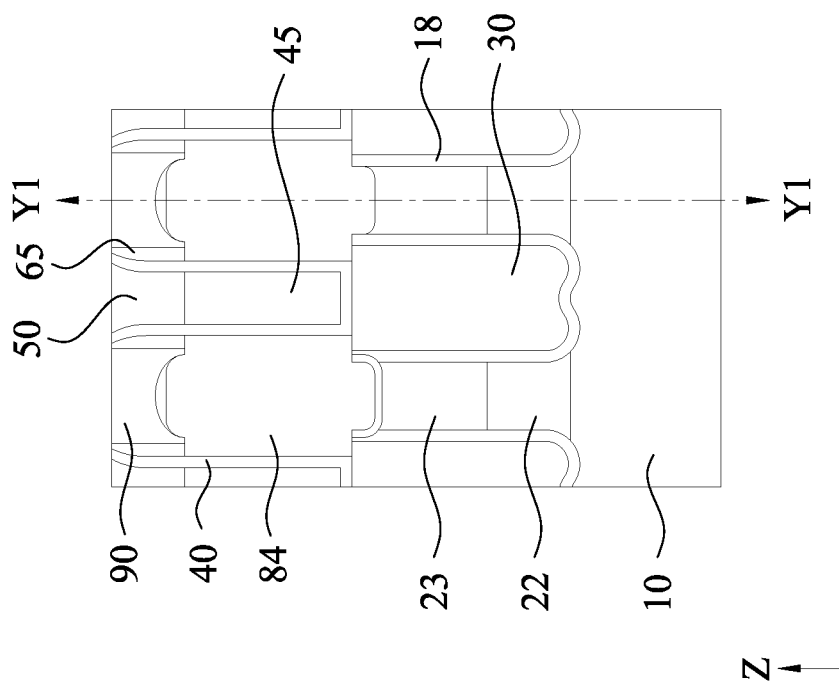
FIGS. 19A, 19B and 19C show various views of one of the various stages of manufacturing a semiconductor GAA FET device according to an embodiment of the present disclosure.
Figure 19C:
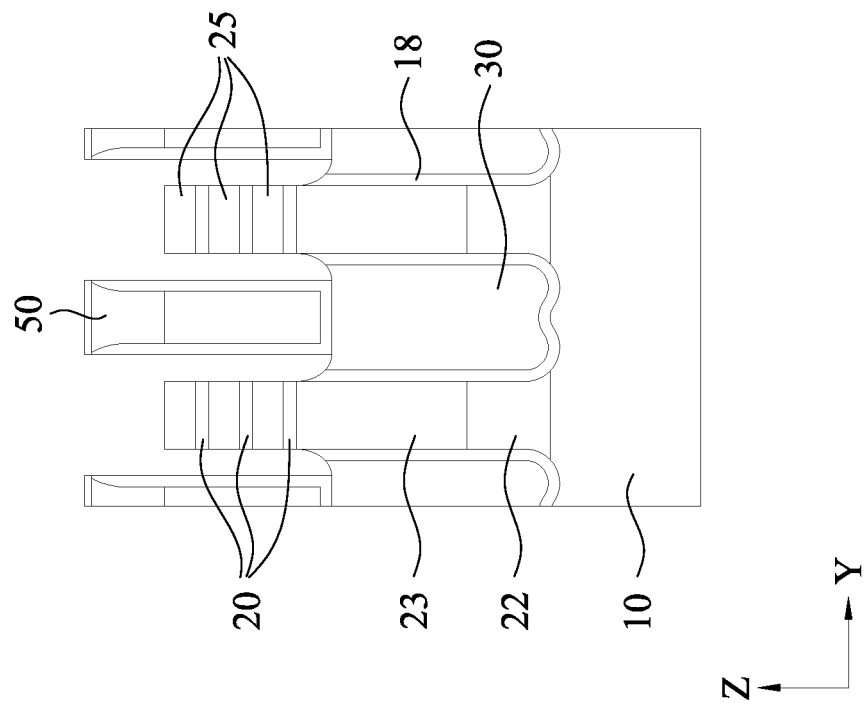
Figure 19B:
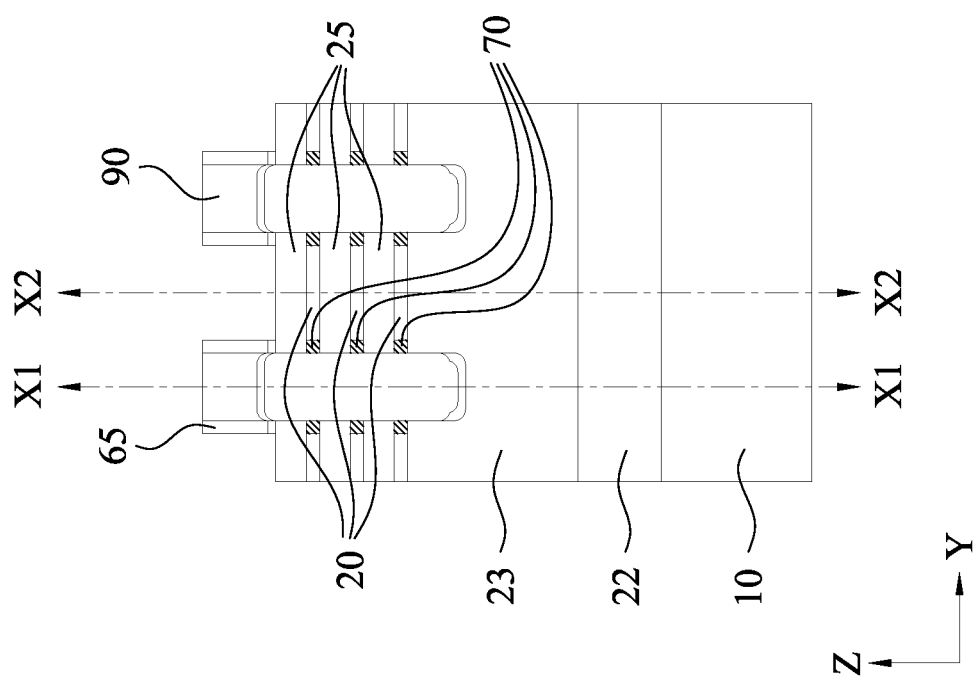

After the sacrificial gate structures are removed, the sacrificial cladding layer 35 is removed by one or more dry and/or wet etching operations, as shown in FIGS. 19A-19C.

Figure 20B:
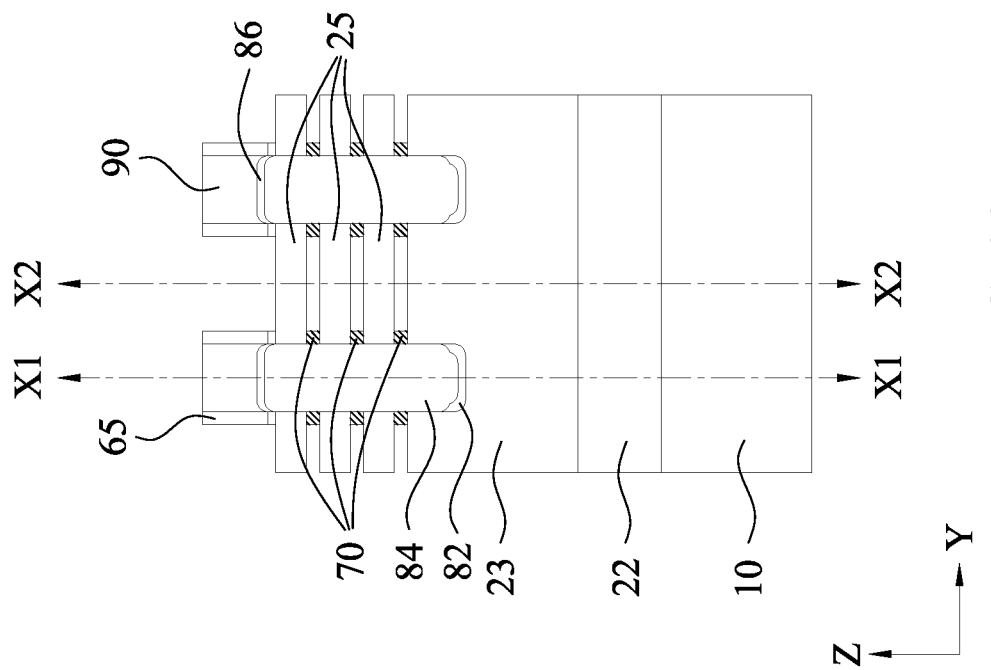
FIGS. 20A, 20B and 20C show various views of one of the various stages of manufacturing a semiconductor GAA FET device according to an embodiment of the present disclosure.
Figure 20A:
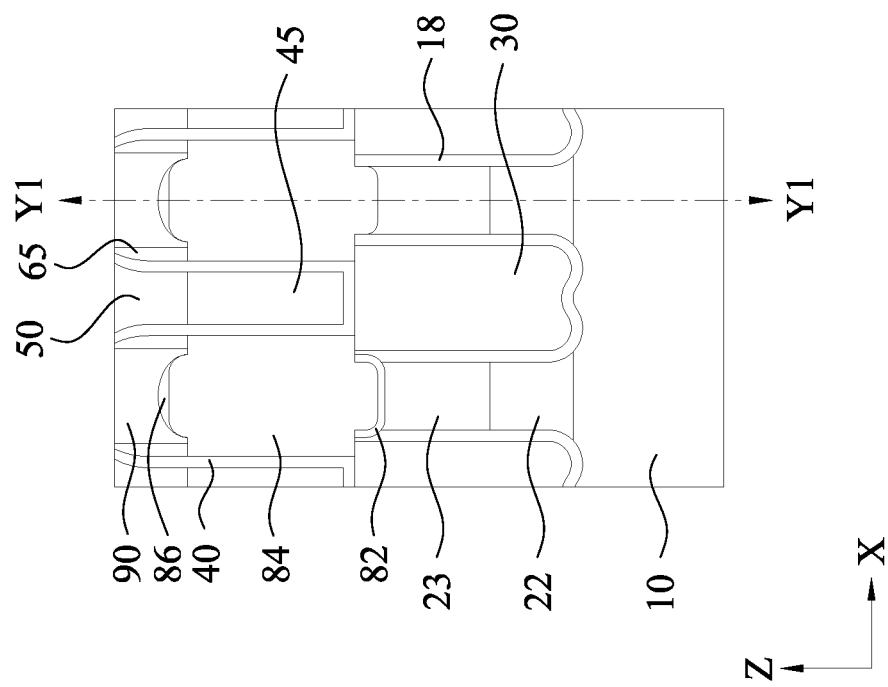
Figure 20C:
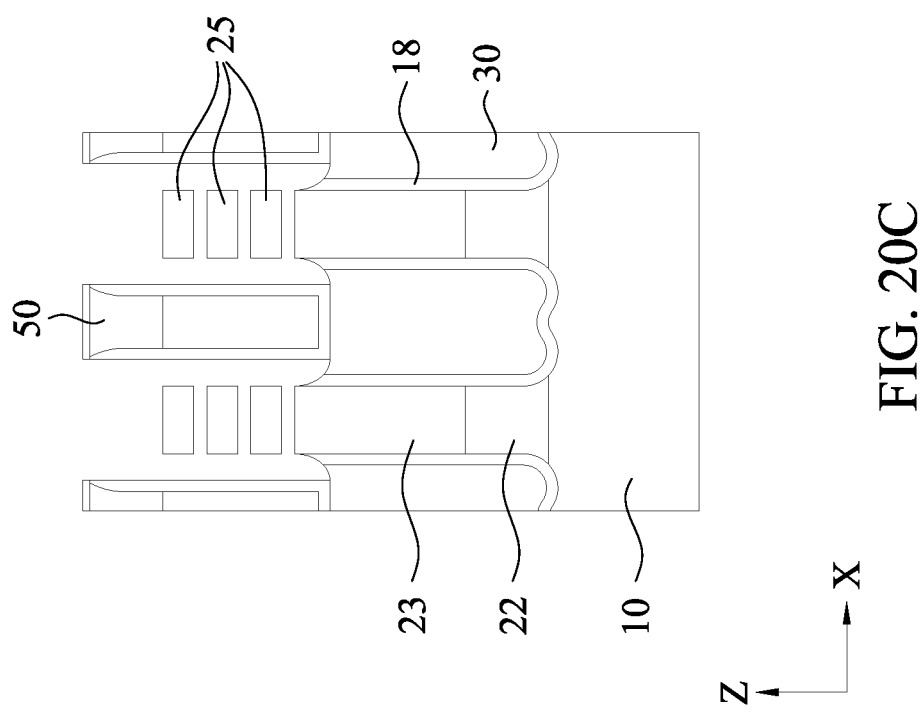

Then, the first semiconductor layers 20 are removed, thereby forming wires or sheets (channel regions) of the second semiconductor layers 25, as shown in FIGS. 20A-20C. The first semiconductor layers 20 can be removed or etched using an etchant that can selectively etch the first semiconductor layers 20 against the second semiconductor layers 25. As shown in FIG. 20B, since the inner spacers 70 are formed, the etching of the first semiconductor layers 20 stops at the inner spacers 70.

Figure 21B:
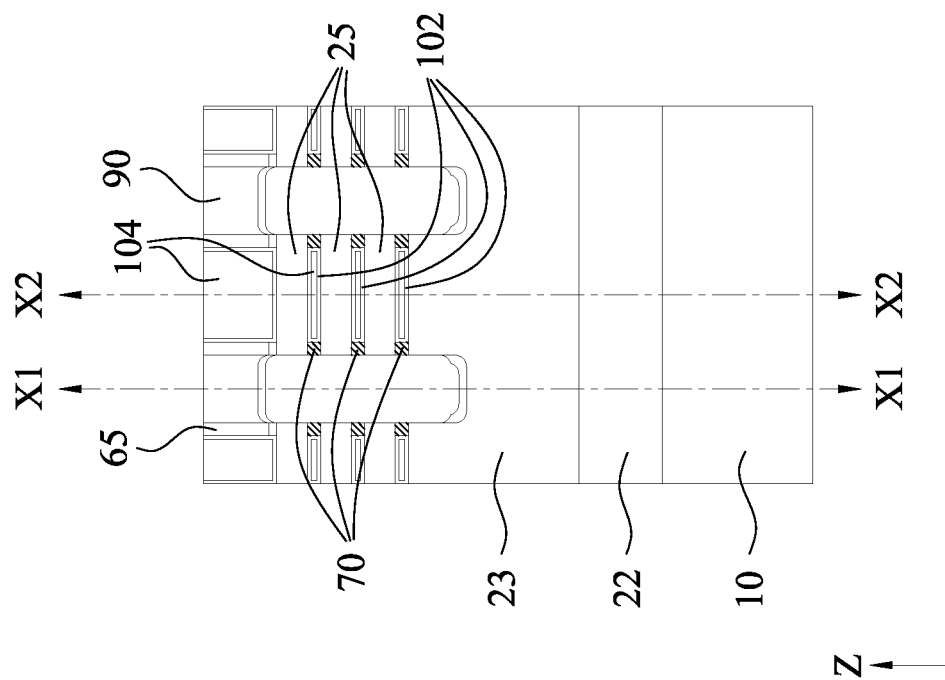
FIGS. 21A, 21B, 21C and 21D show various views of one of the various stages of manufacturing a semiconductor GAA FET device according to an embodiment of the present disclosure.
Figure 21A:
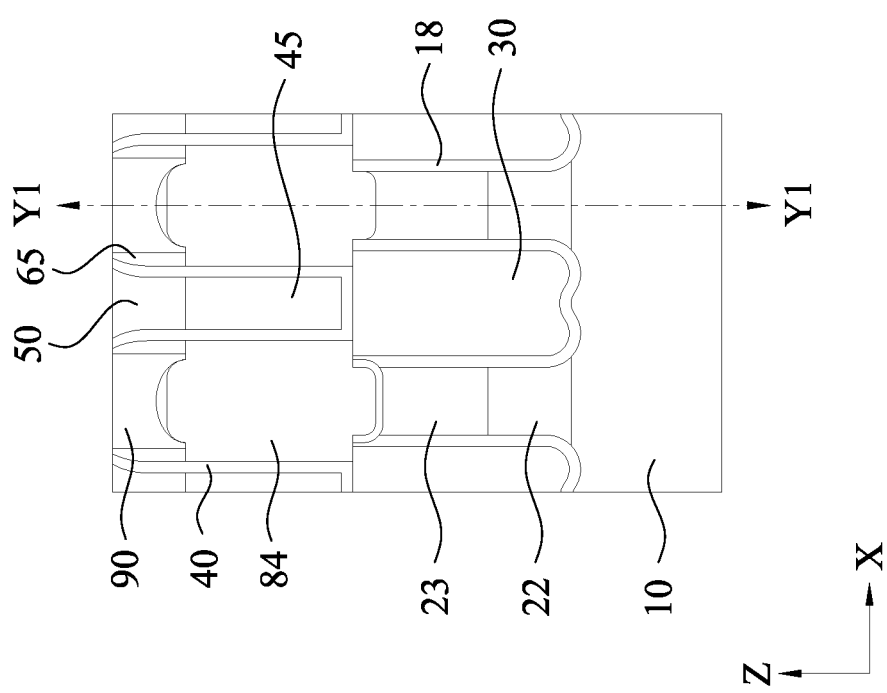
Figure 21D:
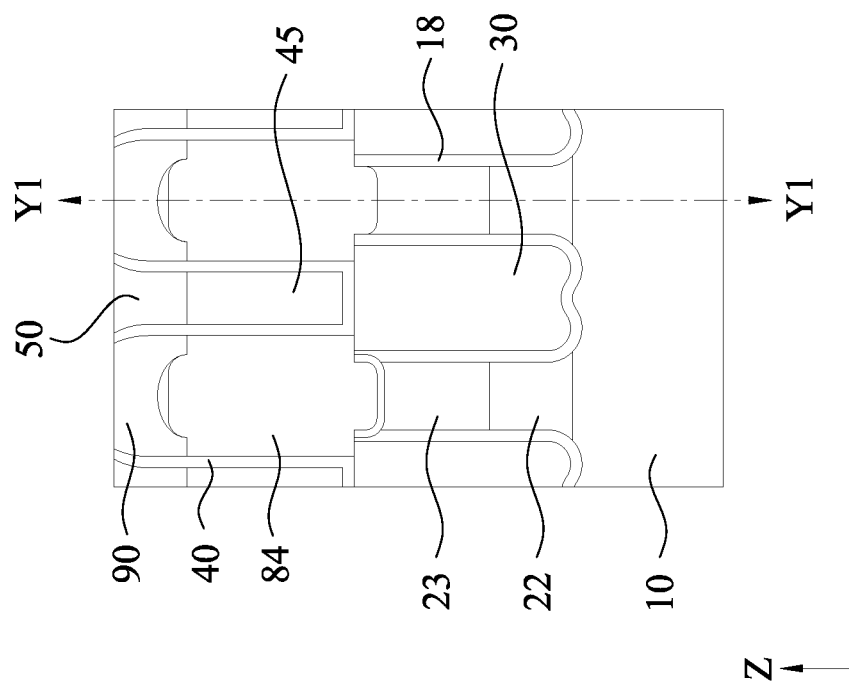
Figure 21C:
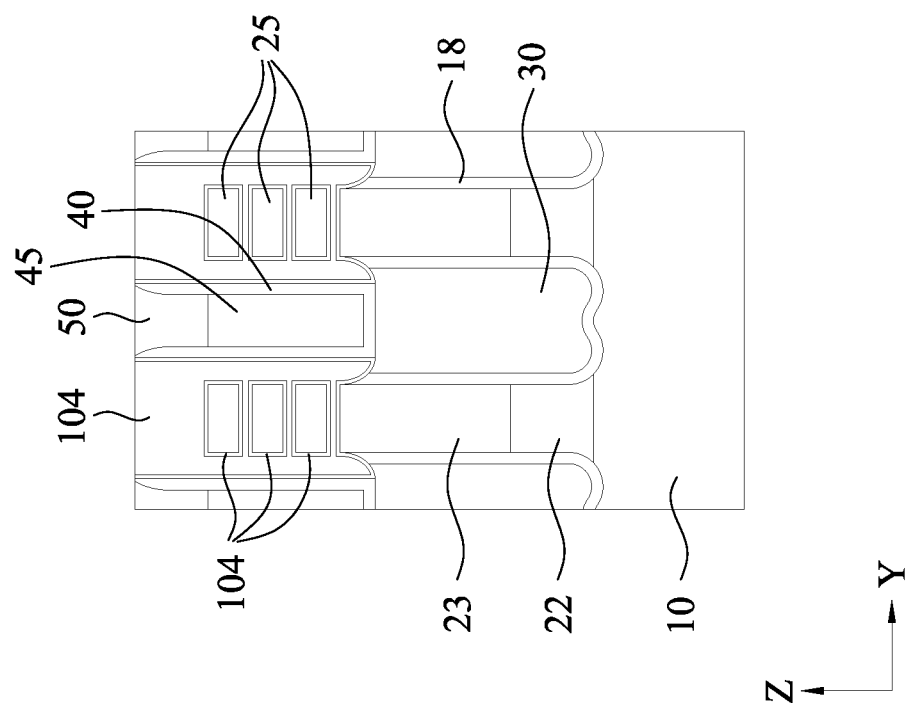

After the semiconductor wires or sheets (channel regions) of the second semiconductor layers 25 are released, a gate dielectric layer 102 is formed around each channel regions, and further, a gate electrode layer 104 is formed on the gate dielectric layer 102, as shown in FIGS. 21A-21C. In some embodiments, the structure and/or material of the gate electrode for the n-type GAA FET are different from the structure and/or material of the gate electrode for the p-type GAA FET. FIG. 21D shows the structure when no sidewall spacer is formed on sidewalls of the first dielectric layer which is on the third dielectric layer 50.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer (not shown) formed between the channel layers and the dielectric material. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate dielectric layer and the gate electrode layer are then planarized by using, for example, CMP, until the top surfaces of the fourth dielectric layer 90 and the third dielectric layer 50 are revealed. In some embodiments, after the planarization operation, the gate electrode layer 104 is recessed and a cap insulating layer (not shown) is formed over the recessed gate electrode 104. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

It is understood that the FET undergoes further CMOS processes to form various features such as contacts/vias, interconnect metal layers, dielectric layers, passivation layers, etc.

According to the embodiments of the present disclosure, a wall fin structure is provided between two GAA FETs, which may be a p-type FET and an n-type FET, to more efficiently isolate one from the other. By employing a wall fin structure having at least two layers made of different material, it is easier to adjust the height of the wall fin structure. Further, by using a high-k dielectric material for the third dielectric layer, it is possible to protect the wall fin structure during the gate replacement operation and/or fin recess etching.

Figure 22B:
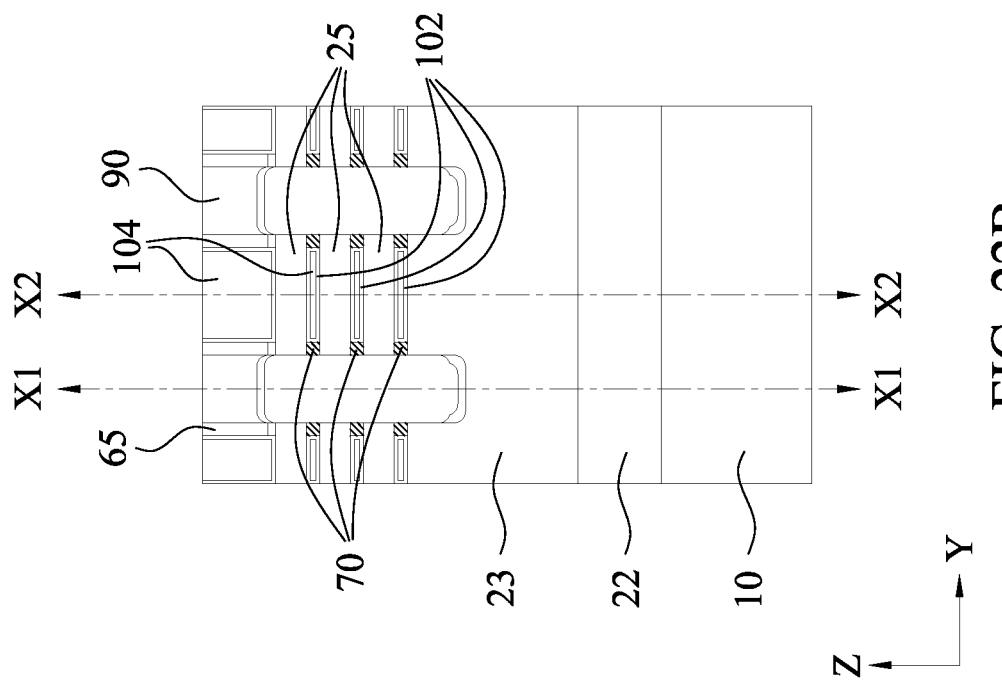
FIGS. 22A, 22B and 22C show various views of one of the various stages of manufacturing a semiconductor GAA FET device according to an embodiment of the present disclosure.
Figure 22A:
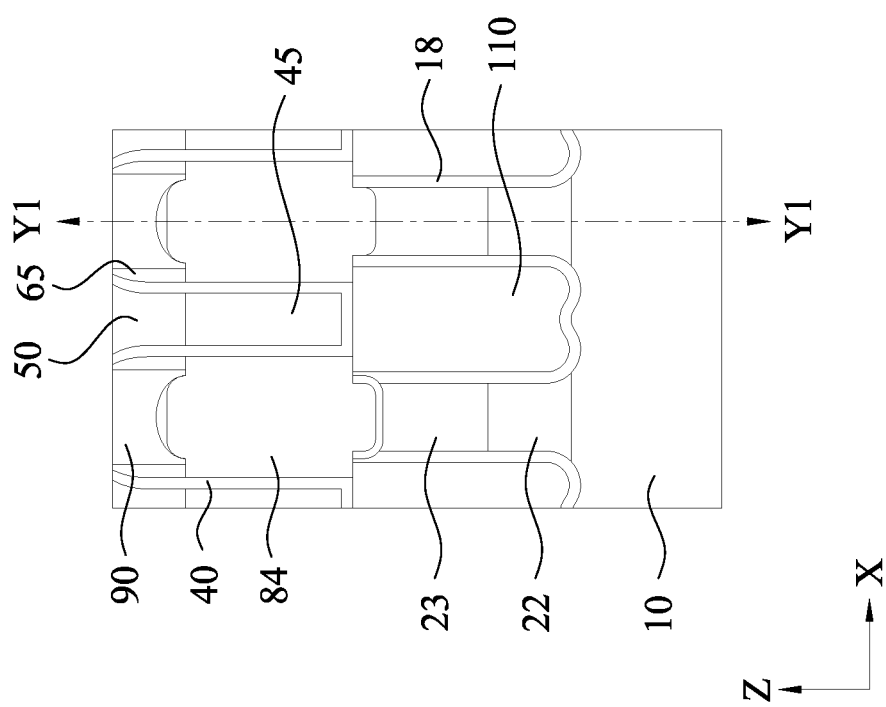
Figure 22C:
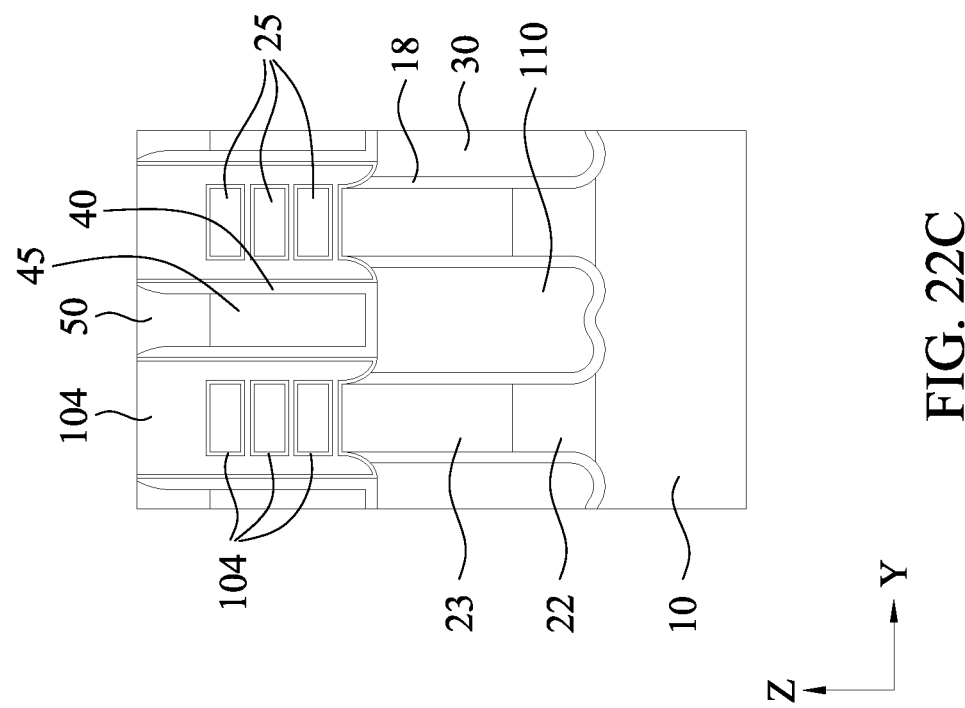

FIGS. 22A-22C show various views of a GAA FET according to an embodiment of the present disclosure. Materials, process, configurations and/or processes described with respect to the forgoing embodiments are employed in the following embodiments, and detailed description thereof may be omitted.

In this embodiment, a buried power supply wiring 110 is formed under the wall fin structure. In some embodiments, the buried power supply wiring 110 is coupled to at least one of a source or a drain of the GAA FET to provide a potential, e.g., Vdd or Vss.

FIGS. 23A-25B show sequential manufacturing operations for fabricating a buried power supply wiring 110 according to an embodiment of the present disclosure. It is understood that additional operations can be provided before, during, and after the processes shown by FIGS. 23A-25B, and some of the operations described below can be replaced or eliminated, for additional embodiments of the method. The order of the operations/processes may be interchangeable. In FIGS. 23A-25B, the fin structures are illustrated as one layer for simplicity, but it should be understood that the fin structure may include multiple layers as shown in FIG. 2.

Figure 23A:
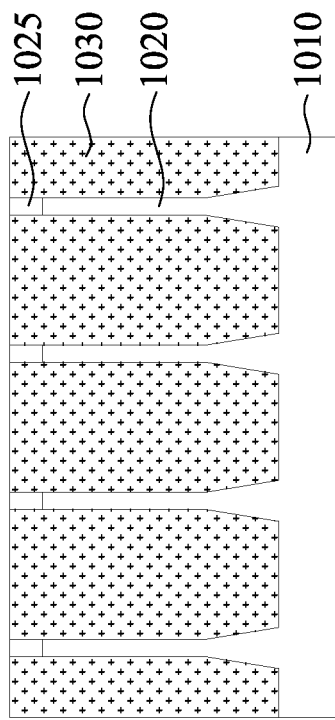
FIGS. 23A, 23B and 23C show cross sectional views illustrating manufacturing operations of buried power wirings according to an embodiment of the present disclosure.

As shown in FIG. 23A, one or more fin structures 1020 are formed over the semiconductor substrate 1010. In some embodiments, the substrate 1010 is made of a suitable elemental semiconductor as explained above.

Figure 23B:
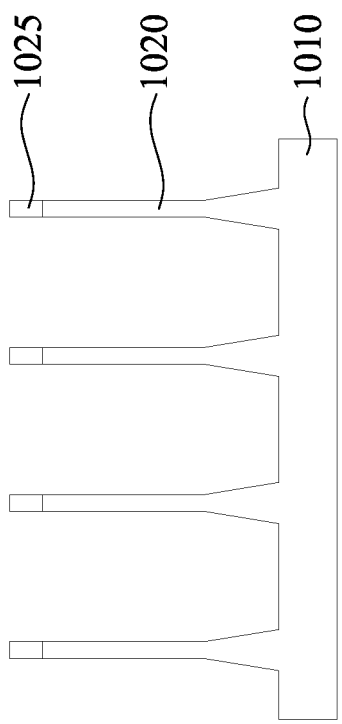

Then, as shown in FIG. 23B, an insulating layer for shallow trench isolation (STI) is formed to embed the fin structures 1020 therein. The insulating layer 1030 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 1030 can be formed by one or more layers of SOG, SiO, SiON, SiOCN or fluorine-doped silicate glass (FSG) in some embodiments. Prior to forming the isolation insulating region 1030, one or more liner layers (not shown) are formed over the substrate 1010 and sidewalls of the bottom part of the fin structures 1020, in some embodiments.

Figure 23C:
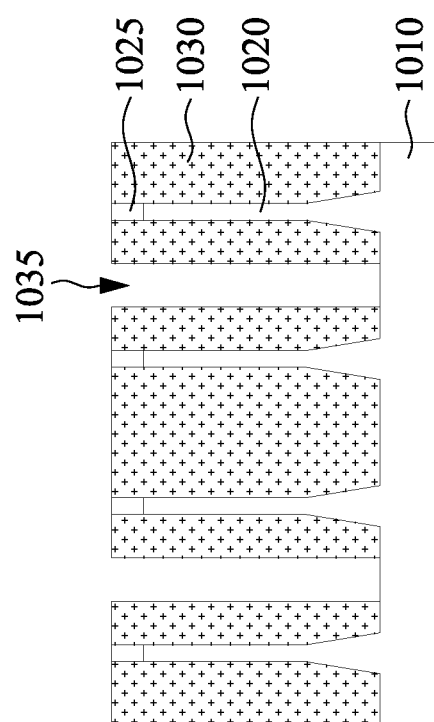

Next as shown in FIG. 23C, trench openings 1035 are formed in the isolation insulating layer 1030 by using one or more lithography and etching operations.

Figure 24B:
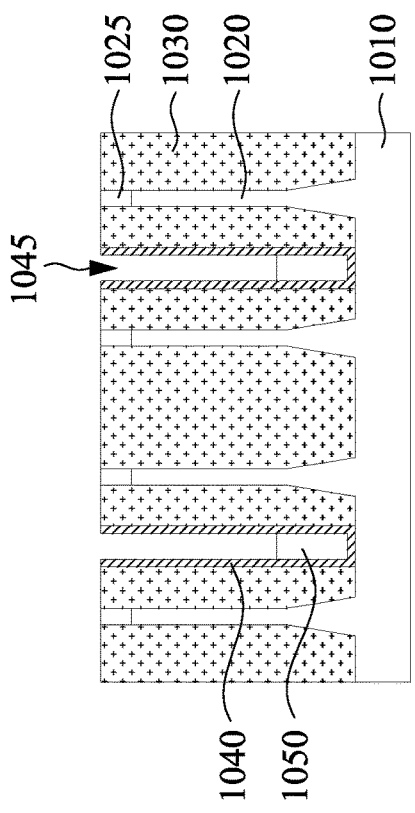
FIGS. 24A, 24B and 24C show cross sectional views illustrating manufacturing operations of buried power wirings according to an embodiment of the present disclosure.
Figure 24A:
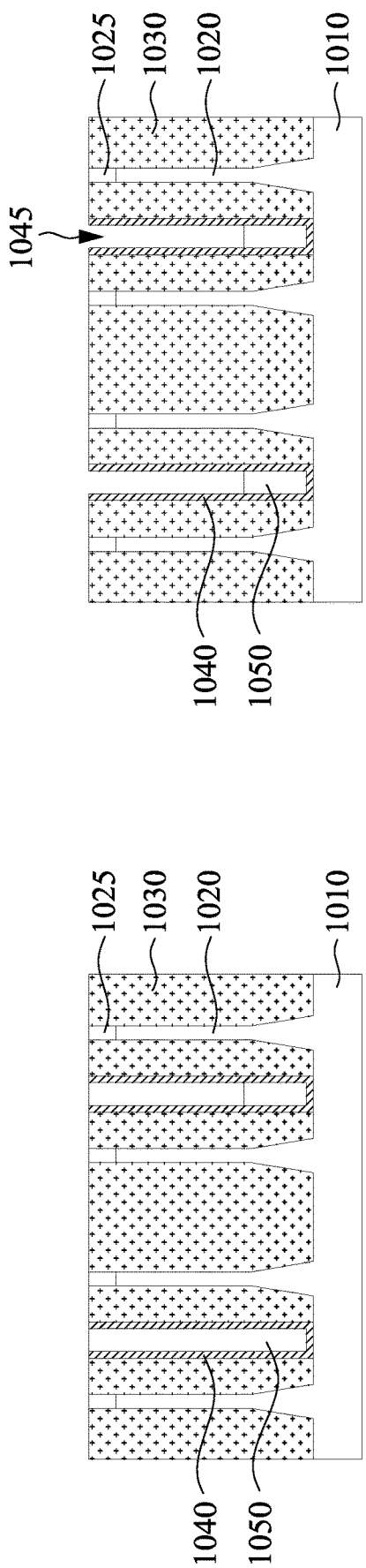

In some embodiments, after a liner insulating layer 1040 is formed in the trench opening, a conductive material 1050 is filled in the trench opening as shown in FIG. 24A. The liner layer 1040 includes one or more of silicon oxide, silicon nitride, SiON, SiOC, SiOCN or any other suitable material. The conductive material 1050 includes one or more conductive materials, such as doped poly silicon, W, Cu, Ti, Ag, Al, TiAl, TiAlN, TaC, TaCN, TaSiN, Mn, Co, Pd, Ni, Re, Jr, Ru, Pt, and Zr, formed by ALD, PVD, CVD, plating or any other suitable methods. After the conductive material 1050 is formed a planarization operation, such as a chemical mechanical polishing (CMP) operation is performed.

Figure 24C:
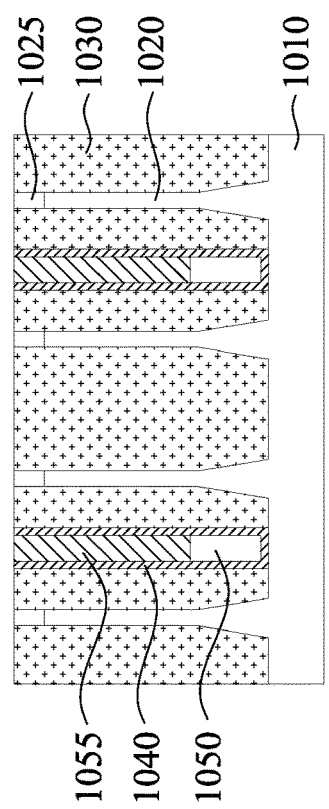

Subsequently, as shown in FIG. 24B, the conductive material 1050 is recessed down to a given depth to form upper openings 1045. The upper openings 1045 are filled with an insulating material 1055 as shown in FIG. 24C. The insulating material 1055 includes one or more of silicon oxide, silicon nitride, SiON, SiOC, SiOCN or any other suitable material.

Figures 25A, 25B:
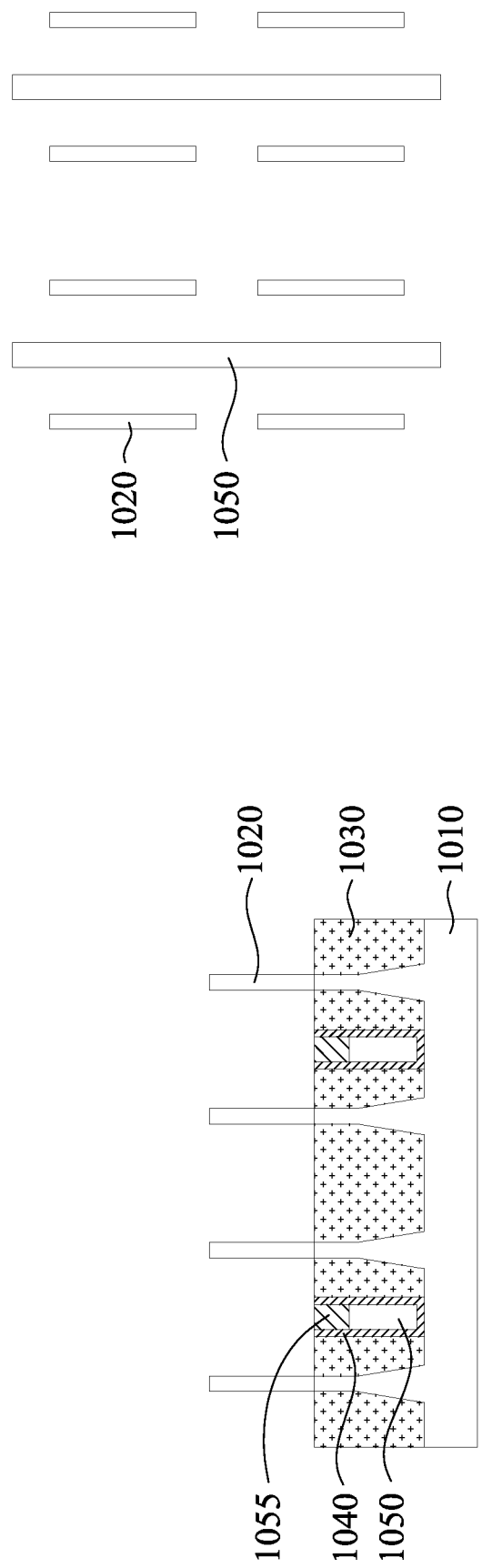
FIGS. 25A and 25B show various views illustrating manufacturing operations of buried power wirings according to an embodiment of the present disclosure.

After the insulating material 1055 is formed, an etch back operation is performed to expose the upper portion of the fin structures 1020. In some embodiments, the isolation insulating layer 1030, the liner layer 1040 and the insulating material 1055 are recessed using a single etch process, or multiple etch processes, including a dry etch, a chemical etch, or a wet cleaning process. As shown in FIG. 25A, part of the insulating material 1055 remains on the conductive material 1050, which corresponds to a buried power supply wiring 110. In some embodiments, insulating material layer 1055 does not remain on the buried power supply wiring 1050. FIG. 25B shows a plan view after the buried power supply wirings 1050 (110) are formed. Subsequently, the operations explained with respect to FIGS. 5-21C are performed.

Figure 26B:
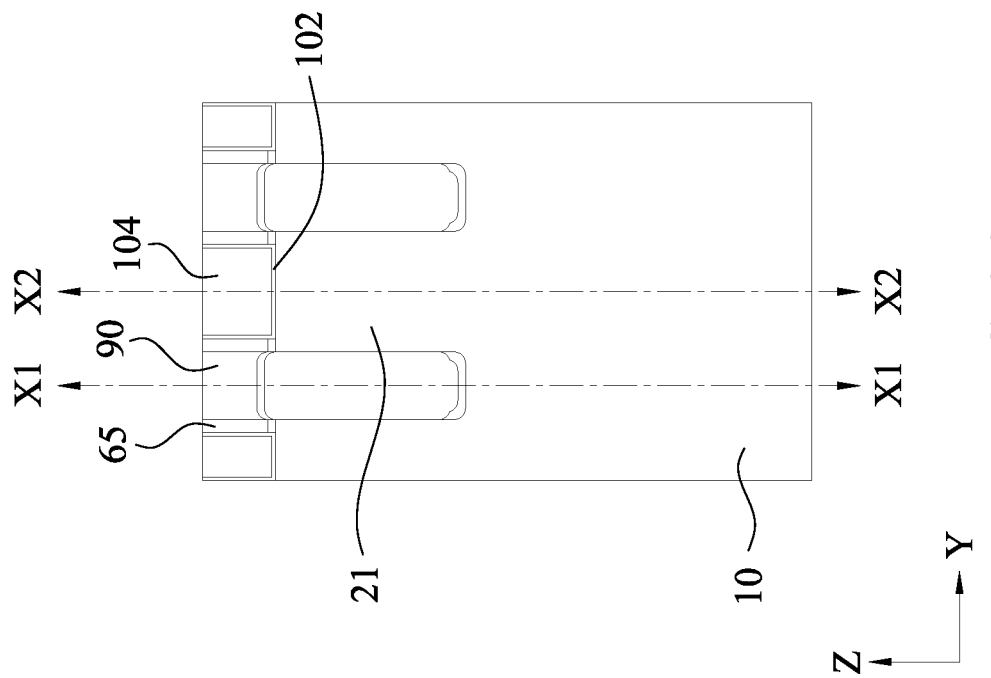
FIGS. 26A, 26B and 26C show various views of one of the various stages of manufacturing a semiconductor FET device according to an embodiment of the present disclosure.
Figure 26A:
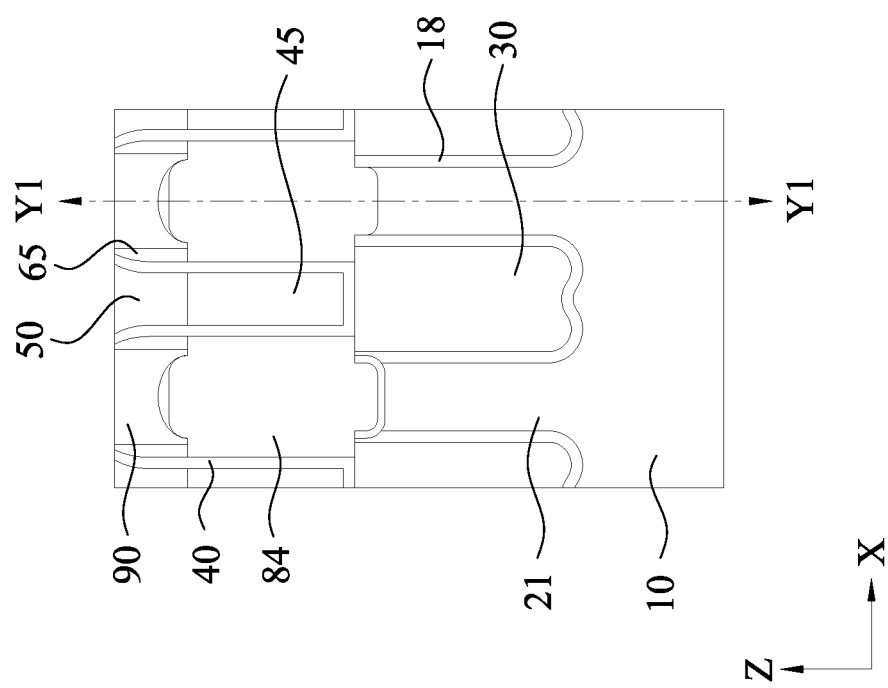
Figure 26C:
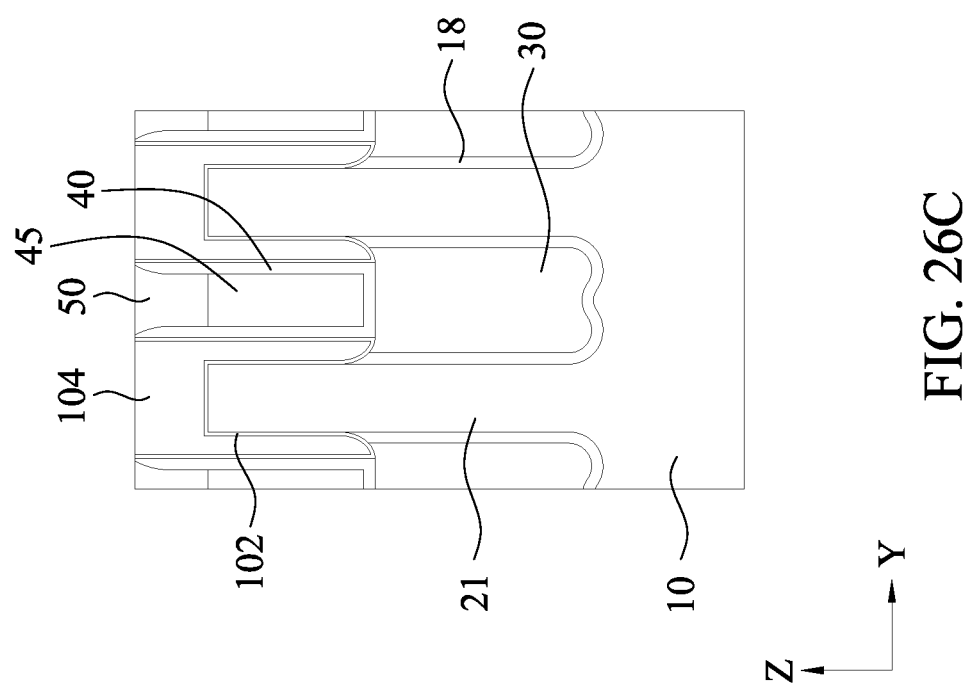

In some embodiments, the wall fin structure as set forth above is applicable to a FinFET as shown in FIGS. 26A-26C. As shown in FIGS. 26A-26C, a fin structure 21 made of, for example, Si, protrudes from the substrate 10 and an upper portion (channel region) protrudes from the isolation insulating layer 30. A bottom portion of the fin structure 21 is embedded in the isolation insulating layer 30 and one or more fin liner layers 18 are formed on the bottom portion. The channel region is covered by a gate dielectric layer 102 and the gate dielectric layer 102 is covered by a gate electrode layer 104. The source/drain epitaxial structure and a wall fin structure are the same as those in the above embodiments.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure is formed. The fin structure includes a stacked layer of first semiconductor layers and second semiconductor layers disposed over a bottom fin structure, and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. A first dielectric layer is formed, and a second dielectric layer made of a different material than the first dielectric layer is formed over the first dielectric layer. The second dielectric layer is recessed, and a third dielectric layer made of a different material than the second dielectric layer is formed on the recessed second dielectric layer, thereby forming a wall fin structure. In one or more of the foregoing or following embodiments, the first semiconductor layers are made of SiGe and the second semiconductor layers are made of Si. In one or more of the foregoing or following embodiments, the sacrificial cladding layer is made of SiGe. In one or more of the foregoing or following embodiments, the sacrificial cladding layer is amorphous or polycrystalline. In one or more of the foregoing or following embodiments, the hard mask layer includes a semiconductor layer and a dielectric layer. In one or more of the foregoing or following embodiments, the semiconductor layer of the hard mask layer is made of SiGe. In one or more of the foregoing or following embodiments, the first dielectric layer include at least one of SiOC, SiOCN or SiCN. In one or more of the foregoing or following embodiments, the second dielectric layer include at least one of silicon nitride, silicon oxide or SiON. In one or more of the foregoing or following embodiments, the third dielectric layer includes at least one of hafnium oxide, zirconium oxide, aluminum oxide or titanium oxide.

In accordance with another aspect of the present disclosure, in a method of manufacturing a semiconductor device, fin structures are formed. Each of the fin structures includes a stacked layer of first semiconductor layers and second semiconductor layers disposed over a bottom fin structure, and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. A first dielectric layer is formed such that the first dielectric layer not fully filling a space between the fin structures. A second dielectric layer made of a different material than the first dielectric layer is formed over the first dielectric layer to fully fill the space between the fin structures. The second dielectric layer is recessed. A third dielectric layer made of a different material than the second dielectric layer is formed on the recessed second dielectric layer, thereby forming a wall fin structure. The hard mask layer is removed. A sacrificial gate structure is formed. Sidewall spacers are formed on sidewalls of the sacrificial gate structure and sidewalls of a part of the wall fin structure. A source/drain structure is formed. A fourth dielectric layer is formed. The sacrificial gate structure is removed. The sacrificial cladding layer is removed. The first semiconductor layers are removed. A metal gate structure is formed around the second semiconductor layers. In one or more of the foregoing or following embodiments, the sacrificial cladding layer is made of amorphous SiGe. In one or more of the foregoing or following embodiments, in the forming the sacrificial cladding layer, a layer for the sacrificial cladding layer is conformally formed over the exposed hard mask layer and stacked layer and on the isolation insulating layer, and a part of the layer on a top of the hard mask layer and on the isolation insulating layer are removed. In one or more of the foregoing or following embodiments, the hard mask layer includes a SiGe layer and a dielectric layer. In one or more of the foregoing or following embodiments, after the third dielectric layer is formed, an upper surface of the SiGe layer is exposed. In one or more of the foregoing or following embodiments, in the removing the hard mask layer, the SiGe layer is removed, thereby exposing a top of the sacrificial cladding layer and a top of an uppermost one of the second semiconductor layers. In one or more of the foregoing or following embodiments, in the forming the source/drain structure, source/drain regions of the fin structures are recessed, and one or more semiconductor epitaxial layers are formed. During the recessing, at least a part of the sacrificial cladding layer is removed. In one or more of the foregoing or following embodiments, in the forming the source/drain structure, after the recessing and before the forming one or more semiconductor epitaxial layers, ends of the first semiconductor layers are laterally recessed, and insulating inner spacers are formed on the recessed ends of the first semiconductor layers.

In accordance with another aspect of the present disclosure, in a method of manufacturing a semiconductor device, fin structures are formed. Each of the fin structures has a semiconductor fin and a hard mask layer on the semiconductor fin, and an upper portion of each of the semiconductor fins protrudes from an isolation insulating layer. A sacrificial cladding layer is formed over at least sidewalls of the hard mask layer and the upper portion of each of the semiconductor fins. A first dielectric layer is formed to partially fill a space between the semiconductor fins. A second dielectric layer made of a different material than the first dielectric layer is formed over the first dielectric layer to fully fill the space. The second dielectric layer is recessed. A third dielectric layer made of a different material than the second dielectric layer is formed on the recessed second dielectric layer, thereby forming a wall fin structure between the fin structures. In one or more of the foregoing or following embodiments, the sacrificial cladding layer is made of amorphous or polycrystalline of SiGe. In one or more of the foregoing or following embodiments, the first dielectric layer include at least one of SiOC, SiOCN or SiCN, the second dielectric layer include at least one of silicon nitride, silicon oxide or SiON, and the third dielectric layer includes at least one of hafnium oxide, zirconium oxide, aluminum oxide or titanium oxide.

In accordance with another aspect of the present disclosure, a semiconductor device includes a first gate-all-around field effect transistor (GAA FET) and a second GAA FET, and a wall fin disposed between the first GAA FET and the second GAA FET and disposed on an isolation insulating layer. The wall fin includes a first dielectric layer, a second dielectric layer disposed over the first dielectric layer and a third dielectric layer, the first, second and third dielectric layers are made of different materials from each other, and the third dielectric layer includes a dielectric material having a dielectric constant higher than the first and second dielectric layers and the isolation insulating layer. In one or more of the foregoing or following embodiments, the first dielectric layer does not fully fill a space between the first GAA FET and the second GAA FET, and the second and third dielectric layers fully fill the space. In one or more of the foregoing or following embodiments, each of the first and second GAA FETs includes a source/drain epitaxial layer, and the first dielectric layer is disposed between the second dielectric layer and the source/drain epitaxial layer. In one or more of the foregoing or following embodiments, the first dielectric layer includes at least one of SiOC, SiOCN or SiCN. In one or more of the foregoing or following embodiments, the second dielectric layer include at least one of silicon nitride, silicon oxide or SiON. In one or more of the foregoing or following embodiments, the third dielectric layer includes at least one of hafnium oxide, zirconium oxide, aluminum oxide or titanium oxide. In one or more of the foregoing or following embodiments, a top of the wall fin is located above a top of the channel region of each of the first GAA FET and the second GAA FET. In one or more of the foregoing or following embodiments, a top of the wall fin is located above a top of the source/drain epitaxial layer of each of the first GAA FET and the second GAA FET. In one or more of the foregoing or following embodiments, the semiconductor device further includes a buried power supply wiring disposed below the wall fin.

In accordance with another aspect of the present disclosure, a semiconductor device includes a first gate-all-around field effect transistor (GAA FET) and a second GAA FET, and a wall fin disposed between the first GAA FET and the second GAA FET and disposed on an isolation insulating layer. Each of the first GAA FET includes semiconductor wires or sheets, a gate dielectric layer wrapping around channel regions of the semiconductor wires or sheets, a gate electrode on the gate dielectric layer and a source/drain epitaxial layer, the wall fin includes a first dielectric layer, a second dielectric layer disposed over the first dielectric layer and a third dielectric layer, the first, second and third dielectric layers are made of different materials from each other, the third dielectric layer includes a dielectric material having a dielectric constant higher than the first and second dielectric layers and the isolation insulating layer, and a fourth dielectric layer different from the first, second and third dielectric layers is disposed on the source/drain epitaxial layer. In one or more of the foregoing or following embodiments, the first dielectric layer does not fully fill a space between the first GAA FET and the second GAA FET, and the second and third dielectric layers fully fill the space. In one or more of the foregoing or following embodiments, the first dielectric layer is disposed between the second dielectric layer and the source/drain epitaxial layer. In one or more of the foregoing or following embodiments, the first dielectric layer include at least one of SiOC, SiOCN or SiCN. In one or more of the foregoing or following embodiments, the second dielectric layer include at least one of silicon nitride, silicon oxide or SiON. In one or more of the foregoing or following embodiments, the third dielectric layer includes at least one of hafnium oxide, zirconium oxide, aluminum oxide or titanium oxide. In one or more of the foregoing or following embodiments, the fourth dielectric layer include silicon oxide. In one or more of the foregoing or following embodiments, the semiconductor device further includes a buried power supply wiring disposed below the wall fin.

In accordance with another aspect of the present disclosure, a semiconductor device includes a first semiconductor fin and a second semiconductor fin disposed over a semiconductor substrate, an isolation insulating layer disposed between the first semiconductor fin and the second semiconductor fin, a wall fin disposed on the isolation insulating layer, a gate structure disposed over a channel region of the first semiconductor fin and a channel region of the second semiconductor fin, a first source/drain epitaxial layer disposed over a source/drain region of the first semiconductor fin and a second source/drain epitaxial layer disposed over a source/drain region of the second semiconductor fin, and a first fin liner layer disposed on a bottom part of the first source/drain epitaxial layer, and a second fin liner layer disposed on a bottom part of the second source/drain epitaxial layer. The first source/drain epitaxial layer and the second source/drain epitaxial layer are separated by the wall fin, the wall fin includes a first dielectric layer, a second dielectric layer disposed over the first dielectric layer and a third dielectric layer, the first, second and third dielectric layers are made of different materials from each other, and the third dielectric layer includes a dielectric material having a dielectric constant higher than the first and second dielectric layers and the isolation insulating layer. In one or more of the foregoing or following embodiments, the third dielectric layer includes doped or non-doped hafnium oxide. In one or more of the foregoing or following embodiments, the first dielectric layer include SiOC, and the second dielectric layer include silicon oxide.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first gate-all-around field effect transistor (GAA FET) and a second GAA FET; and
a wall fin disposed between the first GAA FET and the second GAA FET and disposed on an isolation insulating layer, wherein:
the first and second GAA FETs include semiconductor wires or sheets, a gate dielectric layer wrapping around channel regions of the semiconductor wires or sheets, a gate electrode on the gate dielectric layer and a source/drain epitaxial layer,
the wall fin includes a first dielectric layer, a second dielectric layer disposed over the first dielectric layer and a third dielectric layer,
the first, second and third dielectric layers are made of different materials from each other,
the third dielectric layer includes a dielectric material having a dielectric constant higher than the first and second dielectric layers and the isolation insulating layer, and
a fourth dielectric layer different from the first, second and third dielectric layers is disposed on the source/drain epitaxial layer.

2. The semiconductor device of claim 1, wherein:
the first dielectric layer does not fully fill a space between the first GAA FET and the second GAA FET, and
the second and third dielectric layers fully fill the space.

3. The semiconductor device of claim 1, wherein the first dielectric layer is disposed between the second dielectric layer and the source/drain epitaxial layer.

4. The semiconductor device of claim 1, wherein the first dielectric layer includes at least one of SiOC, SiOCN or SiCN.

5. The semiconductor device of claim 1, wherein the second dielectric layer includes at least one of silicon nitride, silicon oxide or SiON.

6. The semiconductor device of claim 1, wherein the third dielectric layer includes at least one of hafnium oxide, zirconium oxide, aluminum oxide or titanium oxide.

7. The semiconductor device of claim 1, wherein the fourth dielectric layer includes silicon oxide.

8. The semiconductor device of claim 1, further comprising a buried power supply wiring disposed below the wall fin.

9. The semiconductor device of claim 1, wherein a top of the wall fin is located above a top of the channel region of each of the first GAA FET fin and the second GAA FET.

10. The semiconductor device of claim 9, wherein a top of the wall fin is located above a top of the source/drain epitaxial layer of each of the first GAA FET fin and the second GAA FET.

11. A semiconductor device comprising:
a first semiconductor fin and a second semiconductor fin disposed over a semiconductor substrate;
an isolation insulating layer disposed between the first semiconductor fin and the second semiconductor fin;
a wall fin disposed on the isolation insulating layer;
a gate structure disposed over a channel region of the first semiconductor fin and a channel region of the second semiconductor fin;
a first source/drain epitaxial layer disposed over a source/drain region of the first semiconductor fin and a second source/drain epitaxial layer disposed over a source/drain region of the second semiconductor fin; and
a first fin liner layer disposed on a bottom part of the first source/drain epitaxial layer, and a second fin liner layer disposed on a bottom part of the second source/drain epitaxial layer, wherein:
the first source/drain epitaxial layer and the second source/drain epitaxial layer are separated by the wall fin,
the wall fin includes a first dielectric layer, a second dielectric layer disposed over the first dielectric layer and a third dielectric layer,
the first, second and third dielectric layers are made of different materials from each other, and
the third dielectric layer includes a dielectric material having a dielectric constant higher than the first and second dielectric layers and the isolation insulating layer.

12. The semiconductor device of claim 11, wherein the third dielectric layer includes doped or non-doped hafnium oxide.

13. The semiconductor device of claim 11, wherein:
the first dielectric layer includes SiOC, and
the second dielectric layer includes silicon oxide.

14. The semiconductor device of claim 11, wherein the first dielectric layer includes at least one of SiOCN or SiCN.

15. The semiconductor device of claim 11, wherein the second dielectric layer includes at least one of silicon nitride or SiON.

16. The semiconductor device of claim 11, wherein the third dielectric layer includes at least one of zirconium oxide, aluminum oxide or titanium oxide.

17. A method of manufacturing a semiconductor device, comprising:
forming fin structures each having a semiconductor fin and a hard mask layer on the semiconductor fin, an upper portion of each of the semiconductor fins protruding from an isolation insulating layer;
forming a sacrificial cladding layer over at least sidewalls of the hard mask layer and the upper portion of each of the semiconductor fins;
forming a first dielectric layer to partially fill a space between the semiconductor fins;
forming a second dielectric layer made of a different material than the first dielectric layer over the first dielectric layer to fully fills the space;
recessing the second dielectric layer; and
forming a third dielectric layer made of a different material than the second dielectric layer on the recessed second dielectric layer, thereby forming a wall fin structure between the fin structures.

18. The method of claim 17, wherein the sacrificial cladding layer is made of amorphous or polycrystalline of SiGe.

19. The method of claim 18, wherein the first dielectric layer includes at least one of SiOC, SiOCN or SiCN.

20. The method of claim 18, wherein:
the second dielectric layer includes at least one of silicon nitride, silicon oxide or SiON, and
the third dielectric layer includes at least one of hafnium oxide, zirconium oxide, aluminum oxide or titanium oxide.

* * * * *